(12) United States Patent
Chun

(10) Patent No.: US 10,651,176 B2
(45) Date of Patent: May 12, 2020

(54) METHOD FOR FORMING A PATTERN AND METHOD FOR FABRICATING A SEMICONDUCTOR DEVICE USING THE SAME

(71) Applicant: SK hynix Inc., Gyeonggi-do (KR)

(72) Inventor: Jae-Houb Chun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/214,369

(22) Filed: Dec. 10, 2018

(65) Prior Publication Data
US 2019/0304983 A1    Oct. 3, 2019

(30) Foreign Application Priority Data

Mar. 30, 2018 (KR) .................. 10-2018-0037458

(51) Int. Cl.
| | |
|---|---|
| H01L 27/108 | (2006.01) |
| H01L 21/033 | (2006.01) |
| H01L 21/3213 | (2006.01) |
| H01L 21/768 | (2006.01) |

(52) U.S. Cl.
CPC .... *H01L 27/10885* (2013.01); *H01L 21/0337* (2013.01); *H01L 21/0338* (2013.01); *H01L 21/32139* (2013.01); *H01L 21/76816* (2013.01); *H01L 27/10814* (2013.01)

(58) Field of Classification Search
None
See application file for complete search history.

(56) References Cited

U.S. PATENT DOCUMENTS

| | | | | |
|---|---|---|---|---|
| 7,378,727 | B2* | 5/2008 | Caspary | H01L 27/10 257/677 |
| 8,618,679 | B2* | 12/2013 | Sim | H01L 21/0337 257/773 |
| 9,425,200 | B2* | 8/2016 | Hwang | H01L 27/10888 |
| 9,590,034 | B2 | 3/2017 | Shin et al. | |
| 9,780,095 | B2* | 10/2017 | Chun | H01L 27/10885 |
| 9,997,525 | B2* | 6/2018 | Sim | H01L 27/11573 |
| 2013/0048603 | A1* | 2/2013 | Kim | G03F 7/0035 216/41 |
| 2015/0371685 | A1* | 12/2015 | Shin | H01L 29/0649 257/506 |

* cited by examiner

*Primary Examiner* — Michael M Trinh
(74) *Attorney, Agent, or Firm* — IP & T Group LLP

(57) ABSTRACT

A method for forming a pattern includes: forming a preliminary pattern having a plate portion and a plurality of pad portions that protrude from an end of the plate portion over a substrate; forming a first hard mask pattern that includes a blocking portion covering the pad portions and a plurality of line portions partially covering the plate portion; forming a spacer on a sidewall of each of the line portions; forming a second hard mask pattern that fills a space between the line portions by contacting the spacer; forming an opening that exposes the plate portion between the first hard mask pattern and the second hard mask pattern by removing the spacer; and forming a plurality of line pattern portions that are respectively coupled to the pad portions by etching an exposed portion of the plate portion through the opening.

20 Claims, 18 Drawing Sheets

METHOD FOR FORMING A PATTERN AND METHOD FOR FABRICATING A SEMICONDUCTOR DEVICE USING THE SAME

CROSS-REFERENCE TO RELATED APPLICATIONS

The present application claims priority under 35 U.S.C. § 119(a) to Korean Patent Application No. 10-2018-0037458, filed on Mar. 30, 2018, which is incorporated herein by reference in its entirety.

BACKGROUND

1. Field

Exemplary embodiments of the present invention relate to a semiconductor device fabrication method, and more particularly, to a method for forming a pattern, and a method for fabricating a semiconductor device by using the pattern forming method.

2. Description of the Related Art

Generally, a plurality of patterns may be formed during a semiconductor device fabrication process. Also, generally, efforts to minimize the critical dimension of a pattern may be limited by the inherent limitations of conventional photolithography process. Due to strong consumer demand for more compact, more capable electronic devices, there is a need to develop a manufacturing method for realizing a smaller critical dimension which exceeds a critical resolution capability of conventional photolithography process.

SUMMARY

Embodiments of the present invention are directed to a pattern forming method capable of simultaneously forming a line portion and a pad portion.

Embodiments of the present invention are directed to a method for fabricating a semiconductor device capable of simultaneously forming a bit line portion and a bit line pad portion.

In accordance with an embodiment of the present invention, a method for forming a pattern includes: forming a preliminary pattern having a plate portion and a plurality of pad portions protruding from an end of the plate portion over a substrate; forming a first hard mask pattern including a blocking portion covering the pad portions and a plurality of line portions partially covering the plate portion; forming a spacer on a sidewall of each of the line portions; forming a second hard mask pattern filling a space between the line portions to contact the spacer; forming an opening that exposes the plate portion between the first hard mask pattern and the second hard mask pattern by removing the spacer; and forming a plurality of line pattern portions that are respectively coupled to the pad portions by etching an exposed portion of the plate portion through the opening.

In the forming of the preliminary pattern, the preliminary pattern may include a plate-shaped plate portion, a plurality of first pad portions that protrude from opposite ends of the plate portion, and a plurality of second pad portions.

In the forming of the first hard mask pattern, the blocking portion of the first hard mask pattern may include a first blocking portion that covers the first pad portions, and the line portions of the first hard mask pattern may include a plurality of first line portions that are extended from the first blocking portion to form a comb-shape pattern.

In the forming of the second hard mask pattern, the second hard mask pattern may include a second blocking portion that covers the second pad portions and include a plurality of second line portions that are extended from the second blocking portion to form a comb shape, and the first line portions and the second line portions may be arrayed in parallel.

In the forming of the first hard mask pattern, the blocking portion of the first hard mask pattern may include a first blocking portion that covers the second pad portions, and the line portions of the first hard mask pattern may include a plurality of first line portions that are extended from the first blocking portion to form a comb shape, and the first hard mask pattern may further include a comb-shaped opening, and the comb-shaped opening may expose the first pad portions and partially exposes the plate portion. In the forming of the second hard mask pattern, the second hard mask pattern may be formed to fill the comb-shaped opening, and the second hard mask pattern may include a second blocking portion that covers the first pad portions and second line portions that are extended from the second blocking portion to form a comb-shape pattern.

These and other features and advantages of the present invention will become apparent from the detailed description of various embodiments in conjunction with the following drawings.

DETAILED DESCRIPTION

Figure 1A:
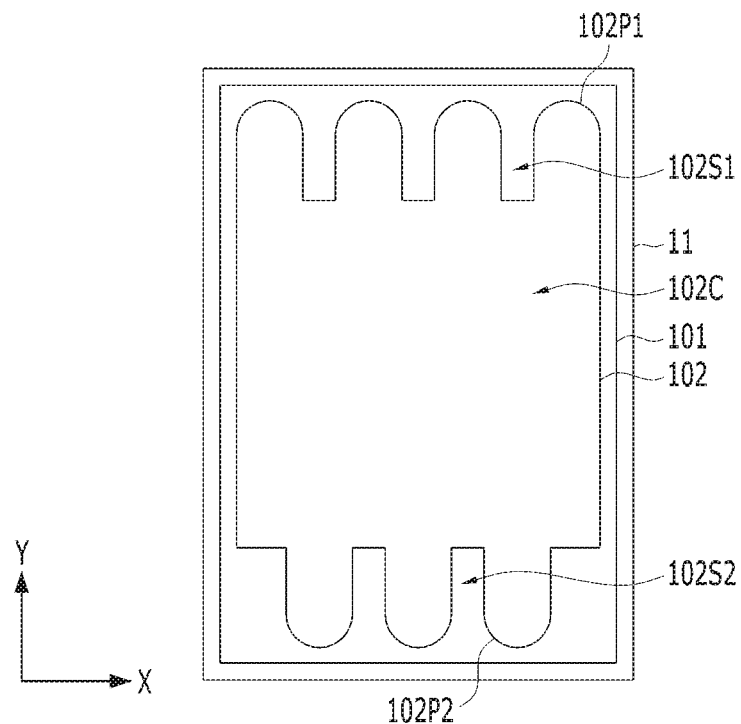
FIGS. 1A to 1K are plan views illustrating a method for forming a pattern of a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1K are plan views illustrating a method for forming a pattern of a semiconductor device in accordance with an embodiment of the present invention.

Referring to FIG. 1A, an etch target layer 101 may be formed over a substrate 11. The substrate 11 may be a single layer or a multi-layer. The substrate 11 may include an insulating layer, a conductive layer, a semiconductor layer, or a combination thereof. The substrate 11 may include a silicon substrate. The substrate 11 may include a silicon substrate in which a Shallow Trench Isolation (STI) is formed. A top layer of the substrate 11 may include a dielectric layer. The etch target layer 101 may be a single layer or multiple layers. The etch target layer 101 may include a dielectric layer, a conductive layer, a semiconductor layer, or a combination thereof. The etch target layer 101 may include a metal layer. The etch target layer 101 may be a stack of a metal layer and a dielectric layer. The etch target layer 101 may include a material in which a polysilicon layer, a metal layer, and a dielectric layer are stacked in the mentioned order.

An etch mask layer 102 may be formed over the etch target layer 101. The etch mask layer 102 may include a photoresist. According to another embodiment of the present invention, the etch mask layer 102 may be made of a material having an etch selectivity with respect to the etch target layer 101. The etch mask layer 102 may include a nitride, an oxide, carbon, anti-reflection coating (ARC), polysilicon, Spin-On-Carbon (SOC), or a combination thereof. The etch mask layer 102 may be a multi-layer of layers each made of a different material. The etch mask layer 102 may be referred to as an etch barrier.

The etch mask layer 102 may include a plurality of first portions 102P1 and a plurality of first spacings 102S1. The etch mask layer 102 may further include a plurality of second portions 102P2 and a plurality of second spacings 102S2. Each of the first spacings 102S1 may be positioned between two corresponding neighboring first portions 102P1. Each of the second spacings 102S2 may be positioned between two corresponding neighboring second portions 102P2.

A portion of the etch target layer 101 may be exposed by the first spacings 102S1 and the second spacings 102S2. The exposed portion of the etch target layer 101 may be regions where no pad portions are to be formed, also referred to as a non-pad portion. The non-exposed portion of the etch target layer 101 covered with the first portion 102P1 and the second portion 102P2 of the etch mask layer 102 may be regions where pads or pad portions are to be formed. The first portions 102P1 of the etch mask layer 102 may have the same size. The second portions 102P2 of the etch mask layer 102 may have the same size. The first portions 102P1 and the second portions 102P2 may have the same size. The first spacings 102S1 of the etch mask layer 102 may have the same size. The second spacings 102S2 of the etch mask layer 102 may have the same size. The first spacings 102S1 and the second spacings 102S2 may have the same size.

The first portions 102P1 and the first spacings 102S1 of the etch mask layer 102 may be alternately and repeatedly formed along the X direction. The first portions 102P1 and the first spacings 102S1 of the etch mask layer 102 may form a continuous pattern of alternating portions and spacings. The second portions 102P2 and the second spacings 102S2 of the etch mask layer 102 may be alternately and repeatedly formed along the direction X. The second portions 102P2 and the second spacings 102S2 of the etch mask layer 102 may form a continuous pattern of alternating portions and spacings. The first portions 102P1 and the second portions 102P2 may be convex portions, and the first spacings 102S1 and the second spacings 102S2 may be concave portions. The ends (or top surfaces) of the first portions 102P1 and the second portions 102P2 may be curved or rounded. The first and second portions 102P1, 102P2 may have generally flat side walls which curve in gradually at their upper end to form a convex top surface. The first spacings 102S1 and the second spacings 102S2 may have a substantially flat bottom surface, and may each share the side walls of its neighboring projecting portions. Although not shown, in a variation of this embodiment the first portions 102P1 and the second portions 102P2 may be convex or substantially convex portions, and the first spacings 102S1 and the second spacings 102S2 may be concave or substantially concave portions.

According to another embodiment of the present invention, the first portions 102P1 and the second portions 102P2 may have a rectangular shape with their side walls and their top surfaces being flat.

The etch mask layer 102 may further include a third portion 102C. The third portion 102C may have a plate shape and may have a larger area than the first portions 102P1, the second portions 102P2, the first spacings 102S1, and the second spacings 102S2. Most of the etch target layer 101 may be covered with the third portion 102C. The first portions 102P1 and the second portions 102P2 may be coupled to respective opposite ends of the third portion 102C. The first portions 102P1 and the second portions 102P2 of the etch mask layer 102 may protrude in a first direction Y from the third portion 102C. From the perspective of the first direction Y, the first portions 102P1 and the second portions 102P2 may protrude from two opposite ends of the third portion 102C. From the perspective of the first direction Y, the first portions 102P1 and the second portions 102P2 may not be formed on the same straight line. The first portions 102P1 may be alternately and repeatedly formed along a second direction X. In other words, the first portions 102P1 may be arrayed in a zigzag manner along the second direction X. Just like the first portions 102P1, the second portions 102P2 may be alternately and repeatedly formed along the second direction X. In other words, the first and the second portions 102P1 and 102P2 may be arrayed in a zigzag manner along the second direction X.

The first portions 102P1 and the second portions 102P2 of the etch mask layer 102 may be referred to as 'a pad defining portion', and the third portion 102C of the etch mask layer 102 may be referred to as a 'plate defining portion'.

Figure 1B:
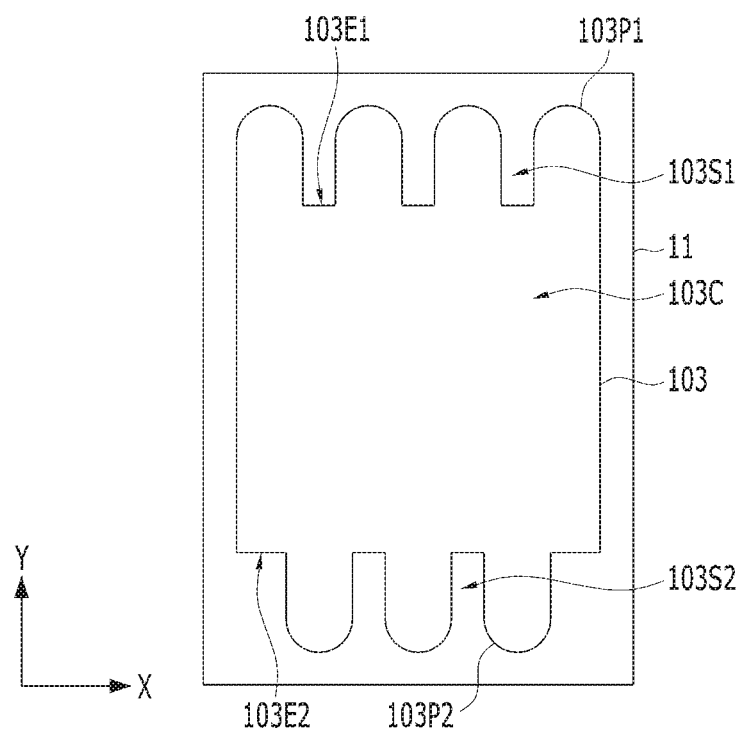

Referring to FIG. 1B, a preliminary pattern 103 may be formed. In order to form the preliminary pattern 103, the etch target layer 101 may be etched by using the etch mask layer 102. The preliminary pattern 103 may include a plurality of pad portions 103P1 and 103P2. The pad portions 103P1 and 103P2 may include a plurality of first pad portions 103P1 and a plurality of second pad portions 103P2.

The preliminary pattern 103 may include a plurality of first pad portions 103P1 and a plurality of first pad spacings 103S1. The preliminary pattern 103 may further include a plurality of second pad portions 103P2 and a plurality of second pad spacings 103S2. Each of the first pad spacings 103S1 may be positioned between two corresponding neighboring first pad portions 103P1. Each of the second pad spacings 103S2 may be positioned between two corresponding neighboring second pad portions 103P2.

A portion of the substrate 11 may be exposed by the first pad spacings 103S1 and the second pad spacings 103S2. The first pad portions 103P1 of the preliminary pattern 103 may have the same size. The second pad portions 103P2 of the preliminary pattern 103 may have the same size. The first pad portions 103P1 and the second pad portions 103P2 may have the same size. The first pad spacings 103S1 of the preliminary pattern 103 may have the same size. The second pad spacings 103S2 of the preliminary pattern 103 may have the same size. The first pad spacings 103S1 and the second pad spacings 103S2 may have the same size.

The first pad portions 103P1 and the first pad spacings 103S1 of the preliminary pattern 103 may be alternately formed repeatedly. The first pad portions 103P1 and the first pad spacings 103S1 of the preliminary pattern 103 may form a continuous pattern of alternating portions and spacings. The second pad portions 103P2 and the second pad spacings 103S2 of the preliminary pattern 103 may be alternately and repeatedly formed along the second direction X. The second pad portions 103P2 and the second pad spacings 103S2 of the preliminary pattern 103 may form a continuous pattern of alternating portions and spacings. The first pad portions 103P1 and the second pad portions 103P2 may be convex portions, and the first pad spacings 103S1 and the second pad spacings 103S2 may be concave portions. The ends (or top surfaces) of the first pad portions 103P1 and the second pad portions 103P2 may be curved or rounded. The first and second pad portions 103P1, 103P2 may have generally flat side walls which curve in gradually at their upper end to form a convex top surface. The first pad spacings 103S1 and the second pad spacings 103S2 may have a substantially flat bottom surface, and may each share the side walls of its neighboring projecting portions. Although not shown, in a variation of this embodiment the first pad portions 103P1 and the second pad portions 103P2 may be convex or substantially convex portions, and the first pad spacings 103S1 and the second pad spacings 103S2 may be concave or substantially concave portions.

According to another embodiment of the present invention, the first pad portions 102P1 and the second pad portions 102P2 may have a rectangular shape with their side walls and their top surfaces being flat.

The preliminary pattern 103 may further include a plate portion 103C. The plate portion 103C may have a form of a flat plate and may have a larger area than the first pad portions 103P1, the second pad portions 103P2, the first pad spacings 103S1 and the second pad spacings 103S2. Most of the substrate 11 may be covered with the plate portion 103C. The first pad portions 103P1 and the second pad portions 103P2 may be coupled to opposite ends of the plate portion 103C. The first pad portions 103P1 and the second pad portions 103P2 of the preliminary pattern 103 may protrude from the plate portion 103C in the first direction Y. From the perspective of the first direction Y, the first pad portions 103P1 and the second pad portions 103P2 may protrude from both opposite end portions of the plate portion 103C. From the perspective of the first direction Y, the first pad portions 103P1 and the second pad portions 103P2 may not be formed on the same straight line. The first pad portions 103P1 may be alternately and repeatedly formed along the second direction X. In other words, the first pad portions 103P1 may be arrayed in a zigzag manner along the second direction X. Just like the first pad portions 103P1, the second pad portions 103P2 may be alternately and repeatedly formed along the second direction X. In other words, the first and second pad portions 103P1 and 103P2 may be arrayed in a zigzag manner along the second direction X.

As described above, the preliminary pattern 103 may be formed in the same shape as the etch mask layer 102. The first pad portions 103P1 may have a shape corresponding to the first portions 102P1 of the etch mask layer 102. The second pad portions 103P2 may have a shape corresponding to the second portions 102P2 of the etch mask layer 102. The plate portion 103C may have a shape corresponding to the third portion 102C of the etch mask layer 102. The ends of the first pad portions 103P1 and the second pad portions 103P2 may be curved or rounded. According to another embodiment of the present invention, the first pad portions 103P1 and the second pad portions 102P2 may have a rectangular shape.

Figure 1C:
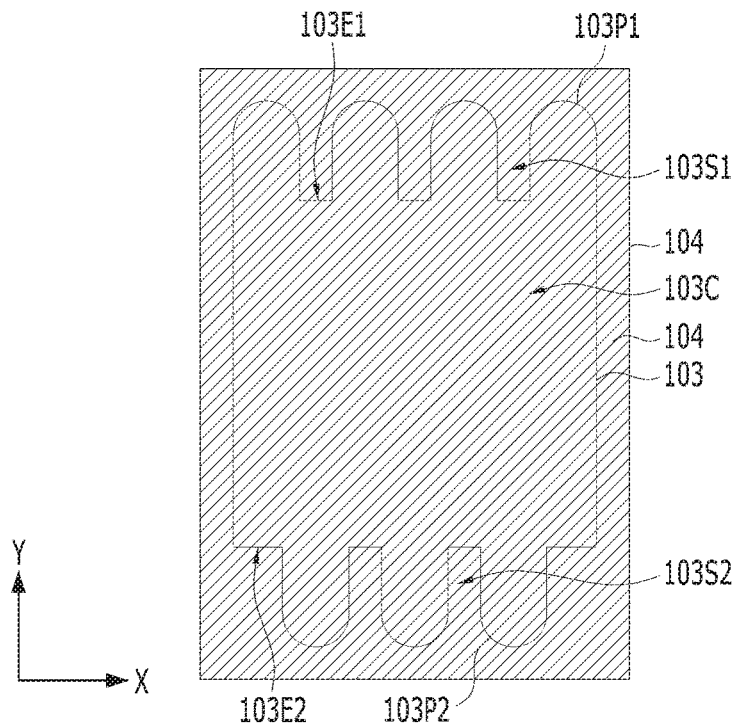
Figure 1D:
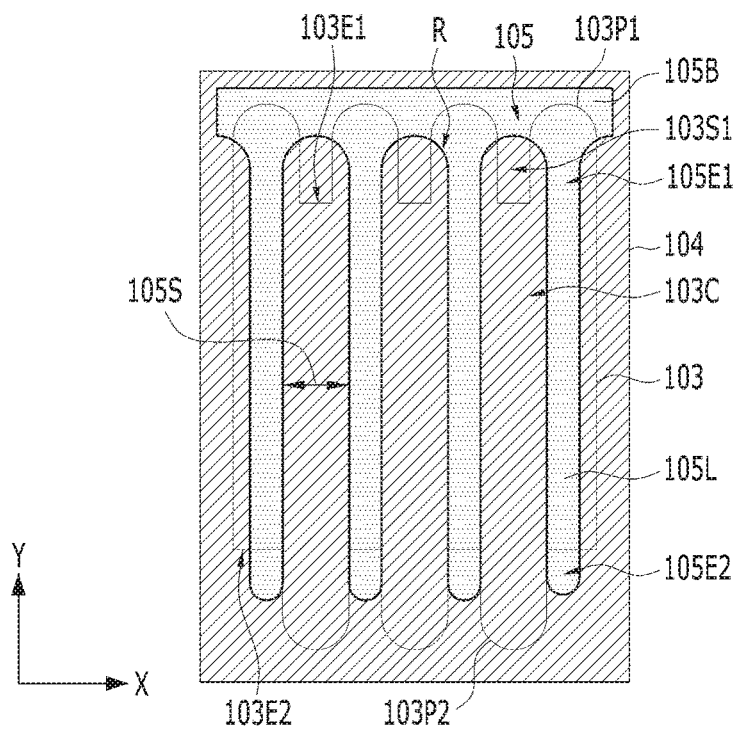
Figure 1E:
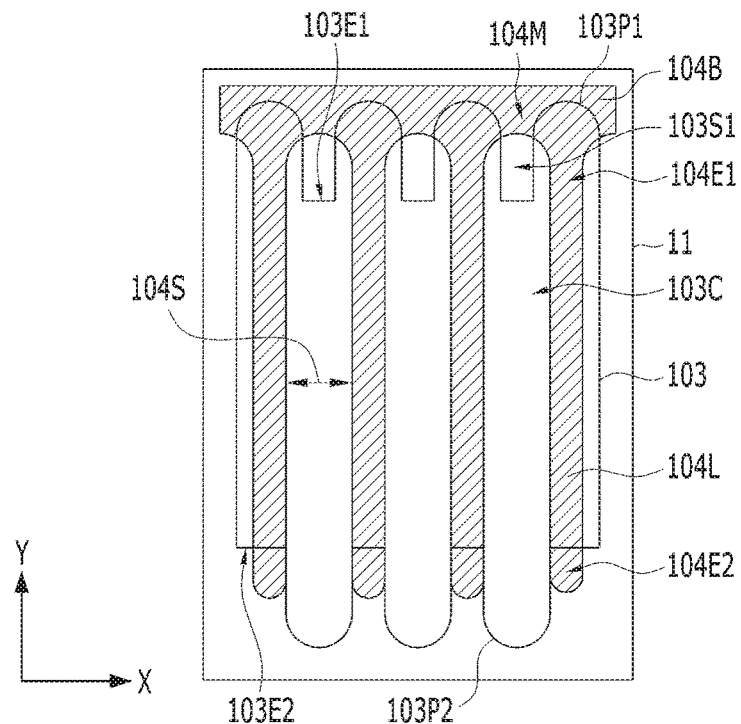
Figure 1F:
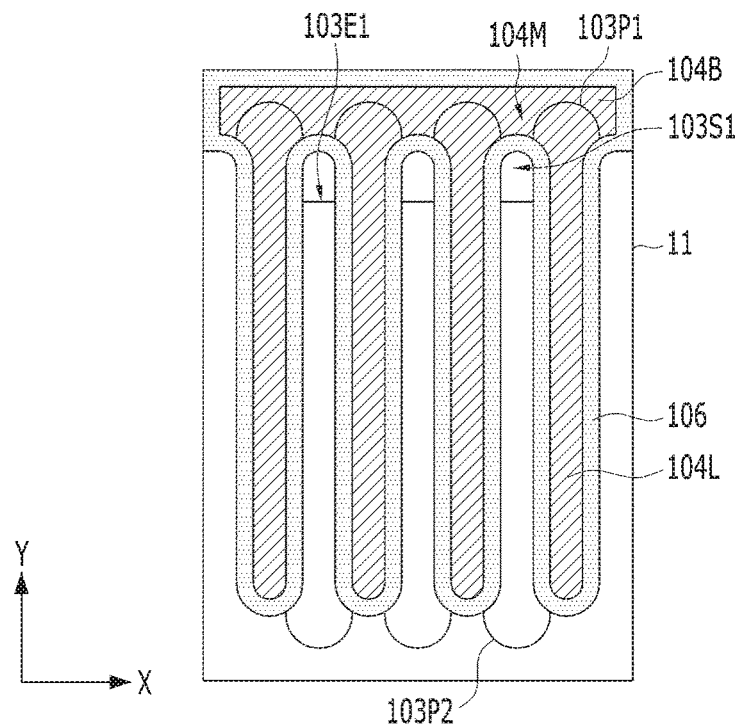
Figure 1G:
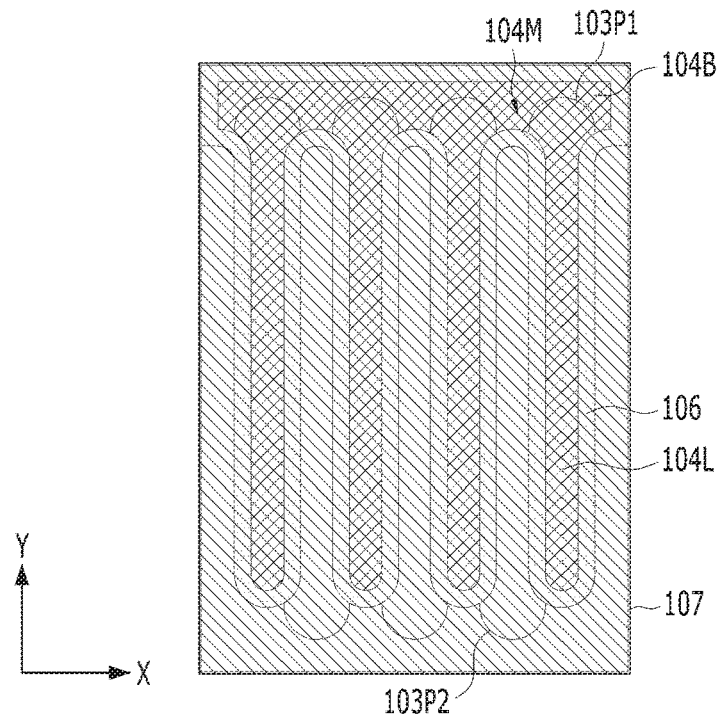
Figure 1H:
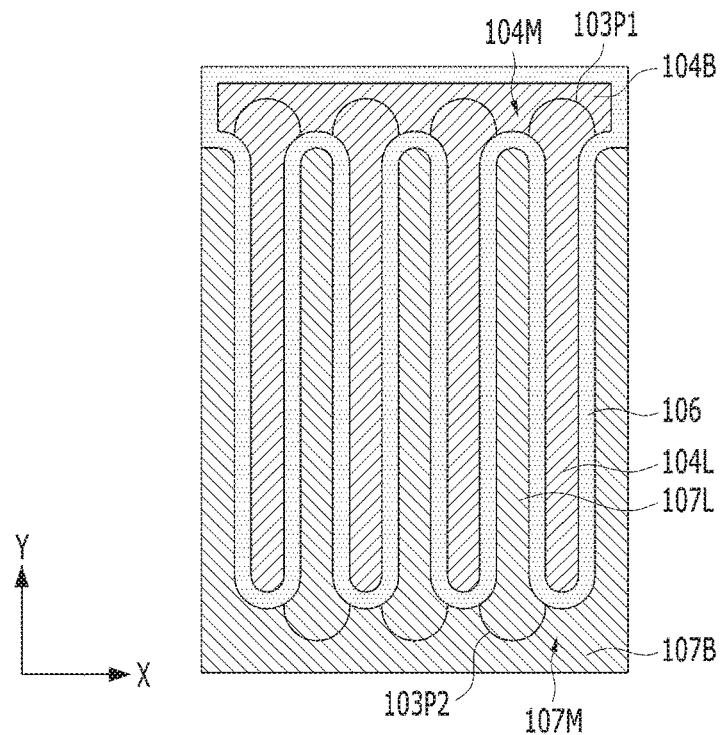
Figure 1I:
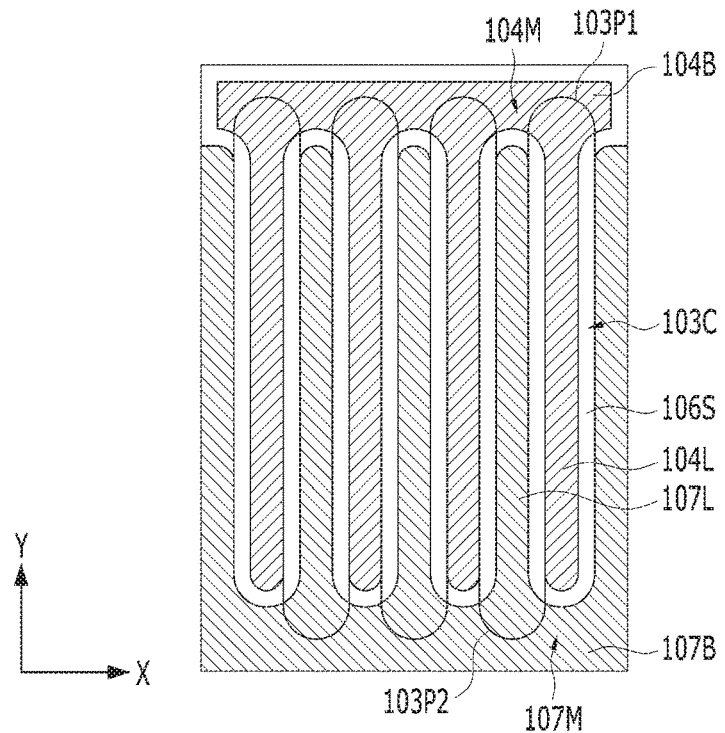
Figure 1J:
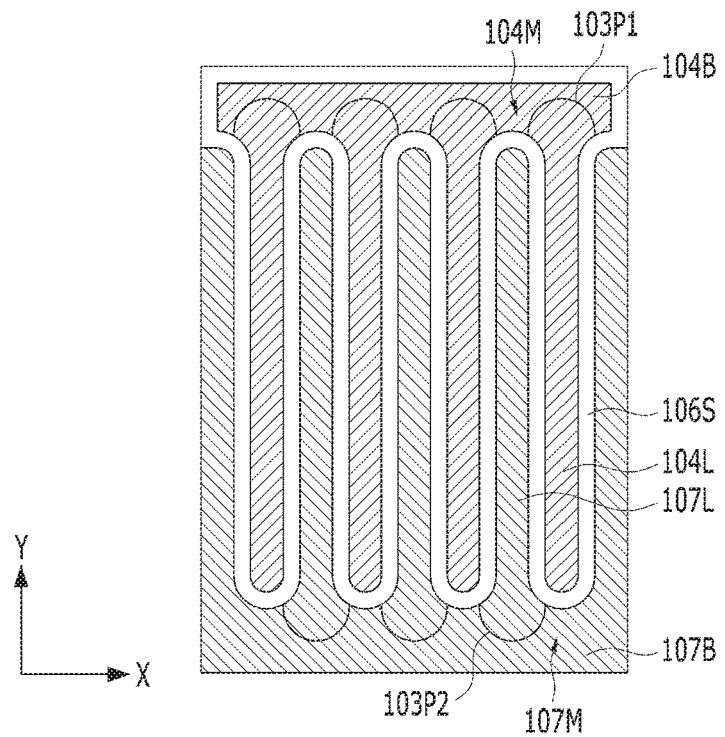
Figure 1K:
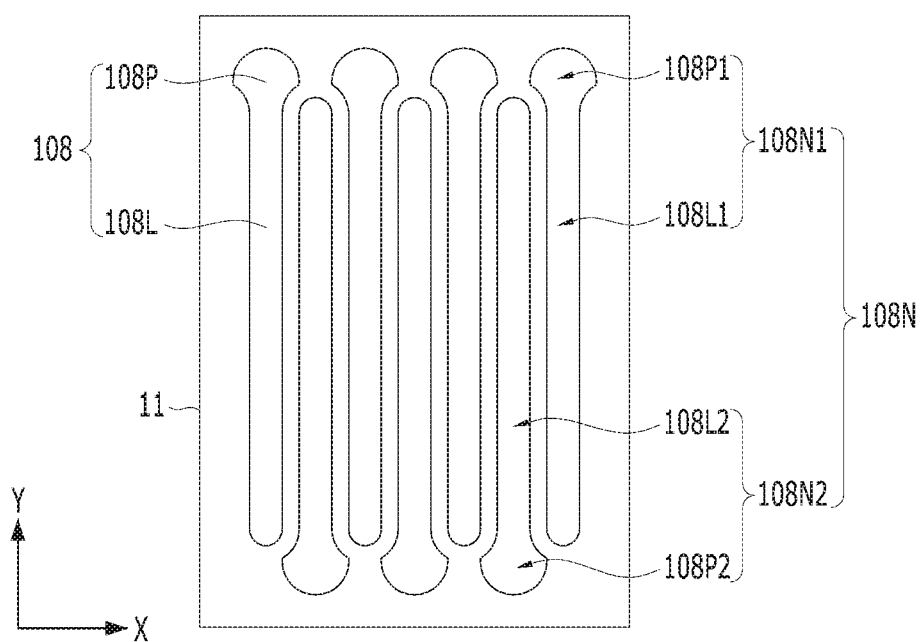

The first pad portions 103P1 and the second pad portions 103P2 of the preliminary pattern 103 may be regions corresponding to the pad portions of a pattern 108 (see 108 in FIG. 1K). In other words, the first pad portions 103P1 and the second pad portions 103P2 of the preliminary pattern 103 may be the portions where the first and second pad portions (see 108P1 and 108P2 in FIG. 1K) of the pattern 108 (see 108 in FIG. 1K) are to be formed. The first pad spacings 103S1 and the second pad spacings 103S2 of the preliminary pattern 103 may be spacings between the first pad portions and the second pad portions.

The plate portion 103C of the preliminary pattern 103 may have a large-area plate shape and may have a larger area than the first pad portions 103P1 and the second pad portions 103P2. Most of the substrate 11 may be covered with the plate portion 103C. The first pad portions 103P1 and the second pad portions 103P2 may be coupled to an end of the plate portion 103C. From the perspective of the first direction Y, the plate portion 103C may include a first end 103E1 and a second end 103E2 that are opposite to each other. The first pad portions 103P1 may be coupled to the first end 103E1 of the plate portion 103C. The second pad 103P2 may be coupled to the second end 103E2 of the plate portion 103C.

The plate portion 103C of the preliminary pattern 103 may be a portion where first and second line pattern portions (see 108L1 and 108L2 in FIG. 1K) of the pattern 108 are to be formed. The plate portion 103C may be referred to as a line forming portion or a portion where a line is to be formed. When this embodiment of the present invention is applied to a bit line structure forming method, it may be referred to as a bit line forming portion.

According to the above description, in this embodiment of the present invention, the first and second pad portions 103P1 and 103P2 may be formed before the formation of the first and second line pattern portions. For example, the first and second pad portions 103P1 and 103P2 may be formed when the preliminary pattern 103 is formed, and the line pattern portion may be formed in a subsequent process.

Subsequently, the etch mask layer 102 may be removed.

As described above, the preliminary pattern 103 may be formed by a single mask and an etch process. Also, the first pad portions 103P1 and the second pad portions 103P2 corresponding to the pad portion of the pattern may be formed first when the preliminary pattern 103 is formed.

Referring to FIG. 1C, a first hard mask layer 104 may be formed. The first hard mask layer 104 may be a material having an etch selectivity with respect to the preliminary pattern 103. The first hard mask layer 104 may include a nitride, an oxide, carbon, polysilicon, SOC, or a combination thereof. The first hard mask layer 104 may be a multi-layer of layers each made of a different material. The first hard mask layer 104 may cover the preliminary pattern 103. A portion of the first hard mask layer 104 may cover an upper surface of the substrate 11. Specifically, the first hard mask layer 104 may cover the upper surface of the substrate 11 which was not covered by the preliminary pattern 103.

Referring to FIG. 1D, a mask 105 may be formed on the first hard mask layer 104. The mask 105 is referred to hereinafter as a 'preliminary mask' or a 'partition mask'. The partition mask 105 may include a body portion 105B and a plurality of line defining portions 105L. A plurality of line spacings 105S may be formed between the line defining portions 105L. The line defining portions 105L may be coupled to the body portion 105B. The body portion 105B may extend in the second direction X. The partition mask 105 may have an etch selectivity with respect to the first hard mask layer 104. The partition mask 105 may include a photoresist.

A portion of the first hard mask layer 104 may be exposed by the line spacings 105S. The line defining portions 105L and the body portion 105B may overlap with each other in such a manner that the first pad portions 103P1 of the preliminary pattern 103 are mostly covered. More specifically, the line defining portions 105L and the body portion 105B may overlap with each other in such a manner that the top convex portions of the first pad portions 103P1 of the preliminary pattern 103 are covered. Also, the second pad portions 103P2 may not overlap with the line defining portions 105L and the body portion 105B. The line spacings 105S may overlap with the plate portion 103C of the preliminary pattern 103 and also may overlap with the second pad portions 103P2.

The line defining portions 105L may have the same size. The line spacings 105S may have the same size. The line defining portions 105L and the line spacings 105S may be alternately and repeatedly formed along the second direction X.

The line defining portions 105L may protrude from the body portion 105B in the first direction Y. The line defining portions 105L may extend in the first direction Y from the body portion 105B. The line defining portions 105L may be arrayed in parallel at a predetermined distance from each other along the second direction X. The plate portion 103C of the preliminary pattern 103 may partially overlap with the line defining portions 105L. A portion of the plate portion 103C of the preliminary pattern 103 may be covered with the line defining portions 105L and another portion of the plate portion 103C of the preliminary pattern 103 may overlap with the line spacings 105S.

The line defining portions 105L may not overlap with a portion of the first pad portions 103P1. The body portion 105B may not overlap with a portion of the first pad portions 103P1. The coupling portion that couples the body portion 105B and the line defining portions 105L may be curved or rounded (see the reference character R). The portion of the first pad portions 103P1 may not overlap with the partition mask 105 due to the rounded coupling portion. The second pad portions 103P2 may not be covered with the body portion 105B and the line defining portions 105L. The ends of the line defining portions 105L may not cover the second pad portions 103P2. From the perspective of a plan view, the ends of the line defining portions 105L may be extended to be positioned outside the end of the plate portion 103C. Each of the line defining portions 105L may include a first end 105E1 and a second end 105E2. The first ends 105E1 of the line defining portions 105L may be extended to be positioned outside the first end 103E1 of the plate portion 103C. The second ends 105E2 of the line defining portions 105L may be extended to be positioned outside the second end 103E2 of the plate portion 103C.

Referring to FIG. 1E, a first mask pattern 104M may be formed. In order to form the first mask pattern 104M, the first mask layer 104 may be etched by using the partition mask 105 as an etch barrier.

After the first mask pattern 104M is formed, the partition mask 105 may be removed. The first mask pattern 104M may have the same shape as that of the partition mask 105.

The first mask pattern 104M may include first line portions 104L and first blocking portion 104B. The first mask pattern 104M may include a plurality of first line portions 104L. A plurality of spacings 104S may be formed between the first line portions 104L. The first line portions 104L may be coupled to the first blocking portion 104B. The first blocking portion 104B may extend in the second direction X.

A portion of the preliminary pattern 103 may be exposed by the spacings 104S. Most of the first pad portions 103P1 may be covered with the first line portions 104L and the first blocking portion 104B. The first mask pattern 104M may not cover the second pad portions 103P2.

The first line portions 104L may have the same size. The spacings 104S may have the same size. The first line portions 104L and the spacings 104S may be alternately and repeatedly formed along the second direction X.

The first line portions 104L may protrude in the first direction Y from the first blocking portion 104B. The first line portions 104L may extend in the first direction Y from the first blocking portion 104B. The first line portions 104L may be arrayed in parallel at a predetermined distance from each other along the second direction X. The first line portions 104L may have a shape corresponding to the line defining portions 105L of the partition mask 105. The first blocking portion 104B may have a shape corresponding to the body portion 105 of the partition mask 105.

The plate portion 103C of the preliminary pattern 103 may be partially exposed by the first line portions 104L. The first line portions 104L may partially overlap with the plate portion 103C of the preliminary pattern 103. A portion of the plate portion 103C of the preliminary pattern 103 may be covered with the first line portions 104L and another portion of the plate portion 103C of the preliminary pattern 103 may be exposed by the spacings 104S. The first pad spacings 103S1 of the preliminary pattern 103 may be partially exposed by the spacing 104S. The ends of the first line portions 104L may partially overlap with the second pad spacings 103S2 of the preliminary pattern 103.

The coupling portion of the first line portions 104L and the first blocking portion 104B may have a shape that follows the shape of the top portion of the first pad portions 103P1. For example, as illustrated in FIG. 1E the coupling portion of the first line portions 104L and the first blocking portion 104B may have a curved or rounded shape and in particular a convex shape. The round-shaped coupling portion may partially cover the first pad portions 103P1, e.g. the top portion of the first pad portions 103P1. The first pad portions 103P1 may be partially covered with the first line portions 104L and the first blocking portion 104B. In particular, the width of each of the first line portions 104L may be smaller than the width of each of the first pad portions 103P1 so that the first pad portions 103P1 may be partially covered with the corresponding first line portions 104L. A portion of the first pad portion 103P1 may be exposed by the first line portions 104L. A portion of the first pad portions 103P1 may be exposed by the first blocking portion 104B. The second pad portion 103P2 may not be covered with the first blocking portion 104B and the first line portions 104L. According to another embodiment of the present invention, the first blocking portion 104B may fully cover the first pad portions 103P1 in which case the ends of the first line portions 104L may not cover the second pad portions 103P2.

Each of the first line portions 104L may include a first end 104E1 and a second end 104E2. The first ends 104E1 of the first line portions 104L may be extended to be positioned outside the first end 103E1 of the plate portion 103C. The second ends 104E2 of the first line portions 104L may be extended to be positioned outside the second end 103E2 of the plate portion 103C.

The first line portions 104L may have a line shape. The first line portions 104L may extend in the first direction Y. The first line portions 104L may be coupled to each other through the first blocking portion 104B.

The first line portions 104L and the first blocking portion 104B may be integrally coupled to form a comb shape pattern. In some embodiments of the present invention, the first hard mask pattern 104M may be referred to as 'a first comb shape hard mask pattern'.

The first blocking portion 104B of the first hard mask pattern 104M may extend in the second direction X, and the first line portion 104L may extend in the first direction Y intersecting with the second direction X, and the first line portions 104L may protrude from the first blocking portion 104B to form a comb-shape.

The partition mask 105 shown in FIG. 1D may be comb-shaped. The body portion 105B of the partition mask 105 may extend in the second direction X and the line defining portions 105L may extend in the first direction Y intersecting with the second direction X, and the line defining portions 105L of the body portion 105B may protrude from the body portion 105B to form a comb-shape.

Referring to FIG. 1F, spacer 106 may be formed. The spacer 106 may be formed on the sidewalls of the first mask pattern 104M, The spacer 106 may surround the first mask pattern 104M. The spacer 106 may include a material having an etch selectivity with respect to the first hard mask pattern 104M. For forming the spacer 106, first an oxide layer may be formed on the first hard mask pattern 104M, and then the oxide layer may be etched back. As a result, spacer 106 surrounding the sidewalls of the first hard mask pattern 104M may be formed. Portions of the preliminary pattern 103 may be exposed by the spacer 106 and the first hard mask pattern 104M. For example, a portion of the plate portion 103C of the preliminary pattern 103 and a majority of the second pad portions 103P2 may be exposed. After the spacer 106 is formed, the first pad spacings 103S1 and the first ends 103E1 of the preliminary pattern 103 may be partially exposed.

The spacer 106 may have a continuous shape, i.e., a closed-loop shape.

Referring to FIG. 1G, the first hard mask pattern 104M and the second hard mask layer 107 may be formed over the spacer 106. The second hard mask layer 107 may be made of a material having an etch selectivity to the preliminary pattern 103. The second hard mask layer 107 may include a nitride, an oxide, carbon, polysilicon, SOC, or a combination thereof. The second hard mask layer 107 and the first hard mask pattern 104M may be formed of the same material. The second hard mask layer 107 may fill the first pad spacings 103S1 of the preliminary pattern 103.

Referring to FIG. 1H, a second hard mask pattern 107M may be formed. No additional mask pattern may be required for forming the second hard mask pattern 107M. For example, an etch-back or chemical-mechanical planarization process may be performed to form the second hard mask pattern 107M. For example, the second hard mask layer 107 may be planarized until the upper surfaces of the first hard mask pattern 104M and the spacer 106 are exposed. According to another embodiment of the present invention, the second hard mask layer 107 may be etched back until the first hard mask pattern 104M and the spacer 106 are exposed. The second hard mask pattern 107M may include second line portions 107L and a second blocking portion 107B. The second hard mask pattern 107M may include a plurality of second line portions 107L. The second line portions 107L may be coupled to the second blocking portion 107B. The second blocking portion 107B may extend in the second direction X.

The coupling portions of the second line portions 107L and the second blocking portion 107B may each have a shape that follows the shape of the top portion of the second pad portions 103P2. For example, the coupling portions may have a curved or rounded shape. The curved or rounded coupling portions may partially cover the second pad portions 103P2. The second pad portions 103P2 may be partially covered with the second line portions 107L and the second blocking portion 107B.

Each of the second line portions 107L may have the same size. The second line portions 107L may be formed repeatedly and alternately along the second direction X.

The second line portions 107L may protrude from the second blocking portion 107B in the first direction Y. The second line portions 107L may extend in the first direction Y from the second blocking portion 107B. The second line portions 107L may be arrayed in parallel at a predetermined distance between them.

The second line portions 107L may have a line shape. The second line portions 107L may extend in the first direction Y. The second line portions 107L may be coupled to each other through one second blocking portion 107B.

The second line portions 107L and the second blocking portion 107B may be integrally coupled to form a comb shape pattern. In some embodiments, the second hard mask pattern 107M may be referred to as 'a second comb shape hard mask pattern'.

According to the above description, a hybrid hard mask pattern may be formed. The hybrid hard mask pattern may include a first hard mask pattern 104M and a second hard mask pattern 107M. The hybrid hard mask pattern may further include the spacer 106. The spacer 106, the first hard mask pattern 104M and the second hard mask pattern 107M may be positioned at the same level. The spacer 106 may have an etch selectivity with respect to the first hard mask pattern 104M and the second hard mask pattern 107M. The first hard mask pattern 104M and the second hard mask pattern 107M may include the same material. The spacer 106, the first hard mask pattern 104M and the second hard mask pattern 107M may have an etch selectivity with respect to the preliminary pattern 103.

The first line portions 104L of the first hard mask pattern 104M and the second line portions 107L of the second hard mask pattern 107M may be arrayed in parallel with each other. The spacer 106 may contact the sidewall of the second hard mask pattern 104M. Thus, the spacer 106 may be positioned between the first hard mask pattern 104M and the second hard mask pattern 107M. The first line portions 104L and the second line portions 107L may not contact each other by the spacer 106. The spacer 106 may be positioned between the first line portions 104L and the second line portions 107L. The first hard mask pattern 104M and the second hard mask pattern 107M may be interdigitated with each other like a cog wheel with the spacer 106 interposed therebetween, The first hard mask pattern 104M, the spacer 106 and the second hard mask pattern 107M may fully cover the preliminary pattern 103. The first blocking portion 104B and the first line portions 104L may partially cover the first pad portions 103P1. The second blocking portion 107B and the second line portions 107L may partially cover the second pad portions 103P2. The first line portions 104L, the second line portions 107L and the spacer 106 may fully cover the plate portion 103C of the preliminary pattern 103.

Referring to FIG. 1I, the spacer 106 may be removed. As a result, openings 106S may be formed. The openings 106S may be defined between the first hard mask pattern 104M and the second hard mask pattern 107M. The openings 106S may be shaped to surround the sidewall of the first hard mask pattern 104M.

The openings 106S may have a wave-like shape or a pulse-like shape. Some portions of the preliminary pattern 103 may be exposed by the openings 106S. For example, the plate portion 103C of the preliminary pattern 103 may be exposed in a wave form by the opening 106S. In addition, the edges on both sides of each of the first pad portions 103P1 and the second pad portions 103P2 may be partially exposed by the openings 106S.

By adjusting the area of the openings 106S, that is, the thickness of the spacer 106, the size of the line pattern portions formed by the etching of the plate portion 103C may be deformed.

Referring to FIG. 1J, the preliminary pattern 103 may be etched to form a plurality of fine patterns 108. As shown in FIG. 1K, the first hard mask pattern 104M and the second hard mask pattern 107M may be removed.

The preliminary pattern 103 may be etched by using the first hard mask pattern 104M and the second hard mask pattern 107M as an etch barrier in order to form the fine patterns 108. The portions of the preliminary pattern 103 exposed by the openings 106S may be etched. The line pattern portions 108L may be formed by etching the plate portion 103C. The plate portion 103C may be etched in a wave shape or a pulse shape. The first and second pad portions 103P1 and 103P2 may be etched at their edges so as to remain as a pad portion 108P. Each of the fine patterns 108 may include a line pattern portion 108L and a pad portion 108P. The pad portion 108P may include a first pad portion 108P1 and a second pad portion 108P2. The first pad portion 108P1 may be formed by etching the edges of the first pad portion 103P1, and the second pad portion 108P2 may be formed by etching the edges of the second pad portion 103P2.

The fine patterns 108 may have an asymmetric structure in which the pad portion 108P is formed at one end of the line pattern portion 108L. From the perspective of the first direction Y, the pad portions 108P may not be formed on the same straight line. Thus, the pad portions 108P may be alternately and repeatedly formed along the second direction X. In short, the neighboring pad portions 108P may be arrayed in a zigzag manner along the second direction X.

A pattern pair 108N disposed adjacent to each other in the second direction X may be asymmetric. The pattern pair 108N may include a first neighboring pattern 108N1 and a second neighboring pattern 108N2. The first neighboring pattern 108N1 may include a first pad portion 108P1. The second neighboring pattern 108N2 may include a second pad portion 108P2. The first neighboring pattern 108N1 and the second neighboring pattern 108N2 may be asymmetric.

The first neighboring pattern 108N1 may include a first line pattern portion 108L1 and a first pad portion 108P1. The second neighboring pattern 108N2 may include a second line pattern portion 108L2 and a second pad portion 108P2. The first line pattern portion 108L1 and the second line pattern portion 108L2 may extend in the first direction Y, individually. The first line pattern portion 108L1 and the second line pattern portion 108L2 may be arrayed in parallel. The first line pattern portion 108L1 may have the same shape as the first line portion 104L of the first hard mask pattern 104M. The second line pattern portion 108L2 may have the same shape as the second line portion 107L of the second hard mask pattern 107M.

The first pad portion 108P1 may be coupled to one end of the first line pattern portion 108L1. The coupling portion of the first line pattern portion 108L1 and the first pad portion 108P1 may be curved or rounded. The first line pattern portion 108L1 and the first pad portion 108P1 may form an integral part. The second pad portion 108P2 may be coupled to one end of the second line pattern portion 108L2. The coupling portion of the second line pattern portion 108L2 and the second pad portion 108P2 may curved or rounded. The second line pattern portion 108L2 and the second pad portion 108P2 may form an integral part. The first pad portion 108P1 and the second pad portion 108P2 may not be adjacent to each other.

The first line pattern portion 108L1 and the second line pattern portion 108L2 may be formed at the same time. In other words, the first line pattern portion 108L1 and the second line pattern portion 108L2 may be formed simultaneously through a one-time etch process using the first hard mask pattern 104M and the second hard mask pattern 107M. Accordingly, the mask and the etching process may be simplified. The first and second pad portions 108P1 and 108P2 may have a line width which is wider than those of the first and second line pattern portions 108L1 and 108L2. The first and second pad portions 108P1 and 108P2 may have a curved or rounded shape such as for example a convex or a ball shape.

The fabrication process may be simplified by simultaneously forming the line pattern portion 108L and the pad portion 108P.

Since the line pattern portion 108L is formed through the openings 106S between the first hard mask pattern 104M and the second hard mask pattern 107M, a cutting mask may not be additionally required.

FIGS. 2A to 2E are plan views illustrating a method for forming a pattern of a semiconductor device in accordance with a modified example of the first embodiment of the present invention. The method for forming a pattern of a semiconductor device according to the modified example of the first embodiment of the present invention may be similar to what is shown in FIGS. 1A to 1K.

Figure 2A:
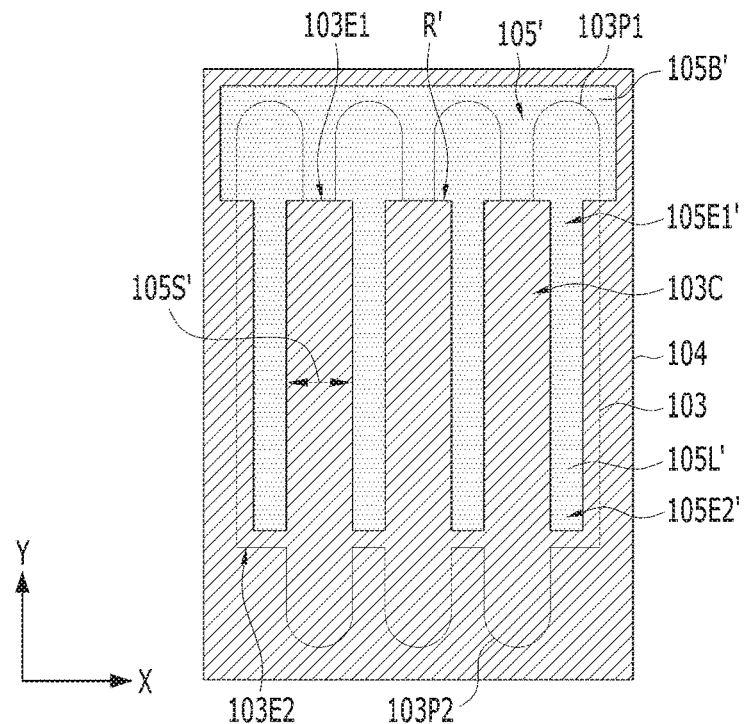
FIGS. 2A to 2E are plan views illustrating a method for forming a pattern of a semiconductor device in accordance with a modified example of an embodiment of the present invention.

Referring to FIG. 2A, a first hard mask layer 104 may be formed over the preliminary pattern 103. A partition mask 105' may be formed over the first hard mask layer 104. Before the formation of the partition mask 105' and the first hard mask layer 104, the preliminary pattern 103 may be formed by the method shown in FIGS. 1A and 1B. The preliminary pattern 103 may be formed over the substrate 11. The preliminary pattern 103 may include a plate portion 103C, a first pad portion 103P1, and a second pad portion 103P2. The plate portion 103C may include a first end 103E1 and a second end 103E2.

A partition mask 105' may be formed over the first hard mask layer 104. The partition mask 105' may have an etch selectivity with respect to the first hard mask layer 104. The partition mask 105' is may include a photoresist. The partition mask 105' may include a body portion 105B' and a plurality of line defining portions 105L'. A plurality of line spacings 105S' may be formed between the line defining portions 105L'. The line defining portions 105L' may be coupled to the body portion 105B'. The body portion 105B' may extend in the second direction X.

A portion of the preliminary pattern 103 may overlap with the line spacings 105S'. Most of the first pad portions 103P1 may be covered with the body portion 105B'. The second pad portions 103P2 may not overlap with the partition mask 105'.

The line defining portions 105L' may have the same size. The line spacings 105S' may have the same size. The line defining portions 105L' and the line spacings 105S' may be alternately and repeatedly formed along the second direction X.

The line defining portions 105L' may protrude from the body portion 105B' in the first direction Y. The line defining portions 105L' may extend in the first direction Y from the body portion 105B'. The line defining portions 105L' may be arrayed in parallel at a predetermined distance from each other along the second direction X. The plate portion 103C of the preliminary pattern 103 may partially overlap with the line defining portions 105L'. A portion of the plate portion 103C of the preliminary pattern 103 may overlap with the line defining portions 105L', and another portion of the plate portion 103C of the preliminary pattern 103 may overlap with the line spacings 105S'.

Differently from the first embodiment of the present invention, in a modified example of the first embodiment of the present invention, the first pad portion 103P1 may be fully covered with the body portion 105B'. The coupling portion of the body portion 105B' and the line defining portions 105L' may be orthogonal (see a reference symbol R'). The first pad portions 103P1 may be fully covered with the orthogonal coupling portion R'. The second pad portions 103P2 may not be covered with the body portion 105B' and the line defining portions 105L'. Each of the line defining portions 105L' may include a first end 105E1' and a second end 105E2'. From the perspective of a plan view, the end of the line defining portion 105L' may not go out of the end of the plate portion 103C. The first end 105E1' of the line defining portion 105L' may not go out of the first end 103E1 of the plate portion 103C. The second end 105E2' of the line defining portion 105L' may not go out of the second end 103E2 of the plate portion 103C. The first end 105E1' of the line defining portion 105L' may be aligned with the first end 103E1 of the plate portion 103C. The second end 105E2' of the line defining portion 105L' may not be aligned with the second end 103E2 of the plate portion 103C. For example, the second end 103E2 of the plate portion 103C may be located outside the second end 105E2' of the line defining portion 105L'. According to another embodiment of the present invention, the second end 105E2' of the line defining portion 105L' may be aligned with the second end 103E2 of the plate portion 103C.

The line defining portions 105L of FIG. 1D and the line defining portions 105L' of FIG. 2A may have the same line width. The line defining portions 105L' may be shorter than the line defining portions 105L.

As described above, the first embodiment and the modified example have different partition masks. For example, the partition mask 105 may be transformed into a partition mask 105'. With the shape of the modified partition mask 105', a first hard mask pattern 104M' and a second hard mask pattern 107M', which are subsequently modified, may be formed.

Figure 2B:
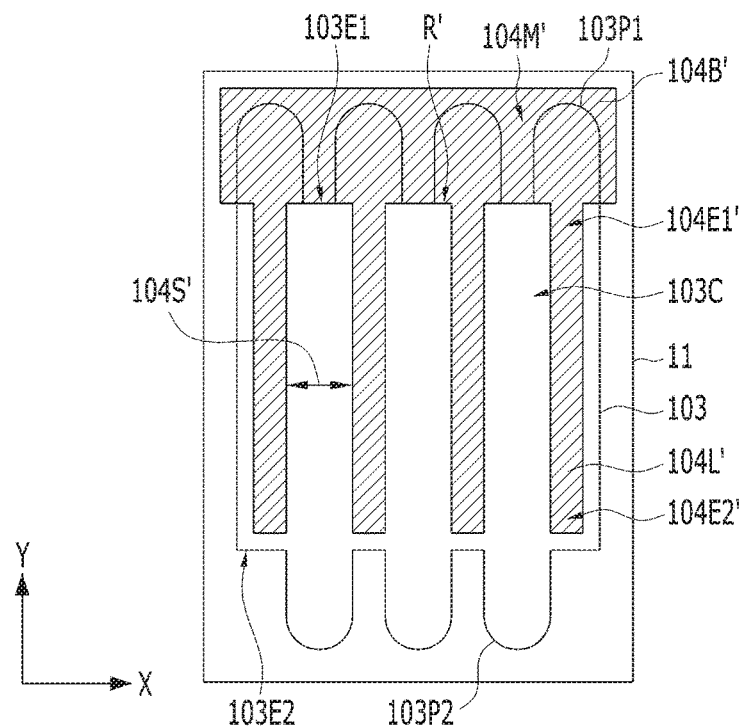

Referring to FIG. 2B, the first hard mask pattern 104M' may be formed. In order to form the first hard mask pattern 104M', the first hard mask layer 104 may be etched by using the partition mask 105' as an etch barrier.

After the first hard mask pattern 104M' is formed, the partition mask 105' may be removed. The first hard mask pattern 104M' may have the same shape as the partition mask 105'.

The first hard mask pattern 104M' may include a first line portion 104L' and a first blocking portion 104B'. The first hard mask pattern 104M' may include a plurality of first line portions 104L'. A plurality of spacings 104S' may be formed between the first line portions 104L'. The first line portions 104L' may be coupled to the first blocking portion 104B'. The first blocking portion 104B' may extend in the second direction X.

A portion of the preliminary pattern 103 may be exposed by the spacings 104S'. The first pad portions 103P1 may be fully covered with the first blocking portion 104B'. The first hard mask pattern 104M' may not cover the second pad portions 103P2.

The first line portions 104L' may have the same size. The spacings 104S' may have the same size. The first line portions 104L' and the spacings 104S' may be alternately and repeatedly formed along the second direction X.

The first line portions 104L' may protrude from the first blocking portion 104B' in the first direction Y. The first line portions 104L' may extend in the first direction Y from the first blocking portion 104B'. The first line portions 104L' may be arrayed in parallel at a predetermined distance from each other along the second direction X. The first line portions 104L' may have a shape corresponding to the line defining portions 105L' of the partition mask 105'. The first blocking portion 104B' may have a shape corresponding to the body portion 105' of the partition mask 105'.

The plate portion 103C of the preliminary pattern 103 may be partially exposed by the first line portions 104L'. The first line portions 104L' may partially overlap with the plate portion 103C of the preliminary pattern 103. A portion of the plate portion 103C of the preliminary pattern 103 may be covered with the first line portions 104L', and another portion of the plate portion 103C of the preliminary pattern 103 may be exposed by the spacings 104S'. The spacings 104S' may partially expose the first pad spacings 103S1 of the preliminary pattern 103. The end of the first line portions 104L' may partially overlap with the second pad spacings 103S2 of the preliminary pattern 103.

Differently from what is shown in the first embodiment of the present invention, in the modified example, the first pad portions 103P1 may be fully covered with the first blocking portion 104B'. The coupling portion of the first blocking portion 104B' and the first line portions 104L' may be orthogonal (see a reference symbol R'). Also, the first pad portions 103P1 may not be exposed by the orthogonal coupling portion R'. The second pad portions 103P2 may not be covered with the first blocking portion 104B' and the first line portions 104L'.

From the perspective of a plan view, the end of the first line portion 104L' may not go out of the end of the plate portion 103C. The first line portion 104L' may include a first end 104E1' and a second end 104E2'. The first end 104E1' of the first line portion 104L' may not go out of the first end 103E1 of the plate portion 103C. The second end 104E2' of the first line portion 104L' may not go out of the second end 103E2 of the plate portion 103C. The first end 104E1' of the first line portion 104L' may be aligned with the first end 103E1 of the plate portion 103C. The second end 104E2' of the first line portion 104L' may not be aligned with the second end 103E2 of the plate portion 103C. For example, the second end 103E2 of the plate portion 103C may be positioned outside the second end 104E2' of the first line portion 104L'. According to another embodiment of the present invention, the second end 104E2' of the first line portion 104L' may be aligned with the second end 103E2 of the plate portion 103C.

The first line portion 104L of FIG. 1E and the first line portion 104L' of FIG. 2B may have the same line width. The first line portion 104L' may be shorter than the first line portion 104.

The first line portion 104L' may have a line shape. The first line portion 104L' may extend in the first direction Y. The first line portions 104L' may be coupled to each other through the first blocking portion 104B'.

The first line portions 104L' and the first blocking portion 104B' may be integrally coupled to form a comb shape pattern. In some embodiments, the first hard mask pattern 104M' may be referred to as 'a first comb shape hard mask pattern'.

Subsequently, a spacer and a second hard mask pattern may be formed in the same method shown in FIGS. 1F to 1H.

Figure 2C:
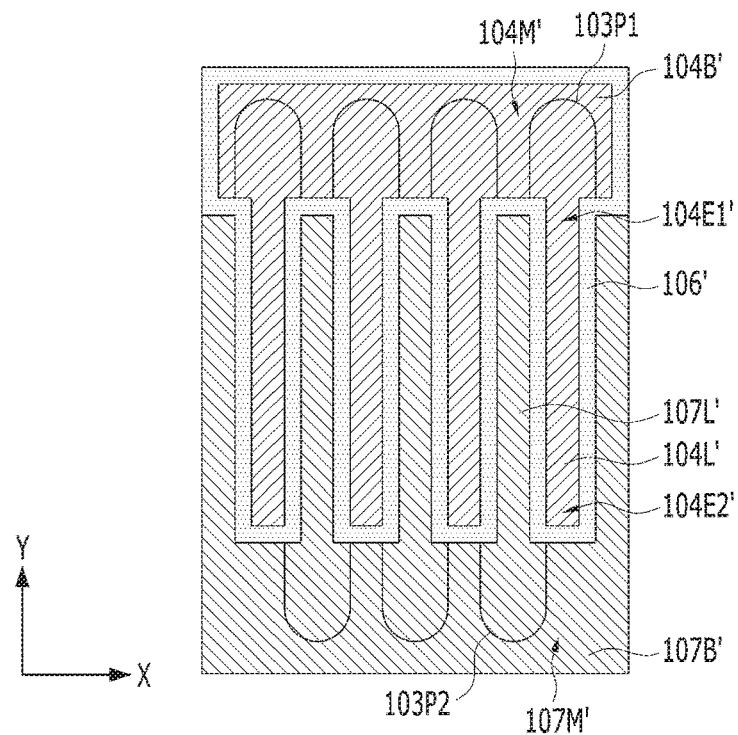
Figure 2D:
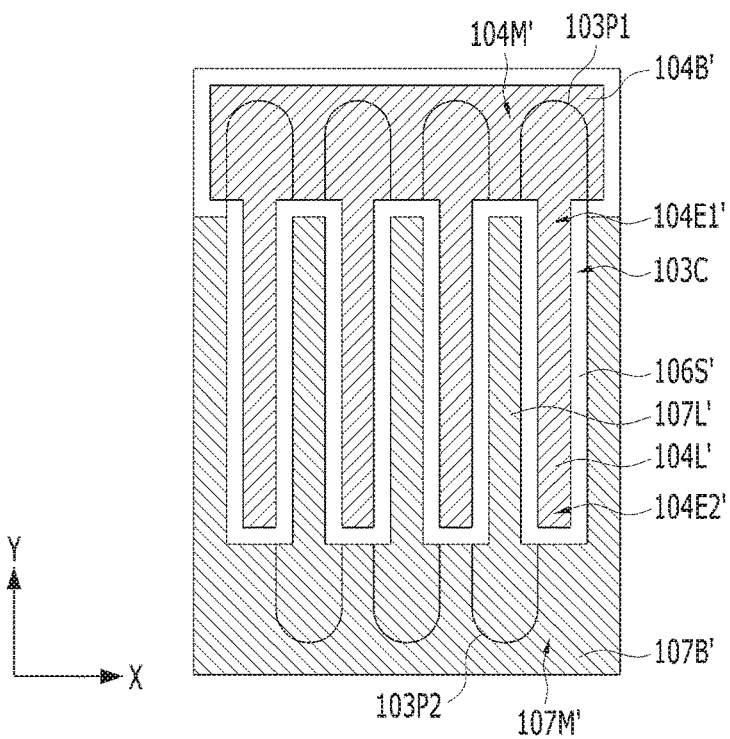
Figure 2E:
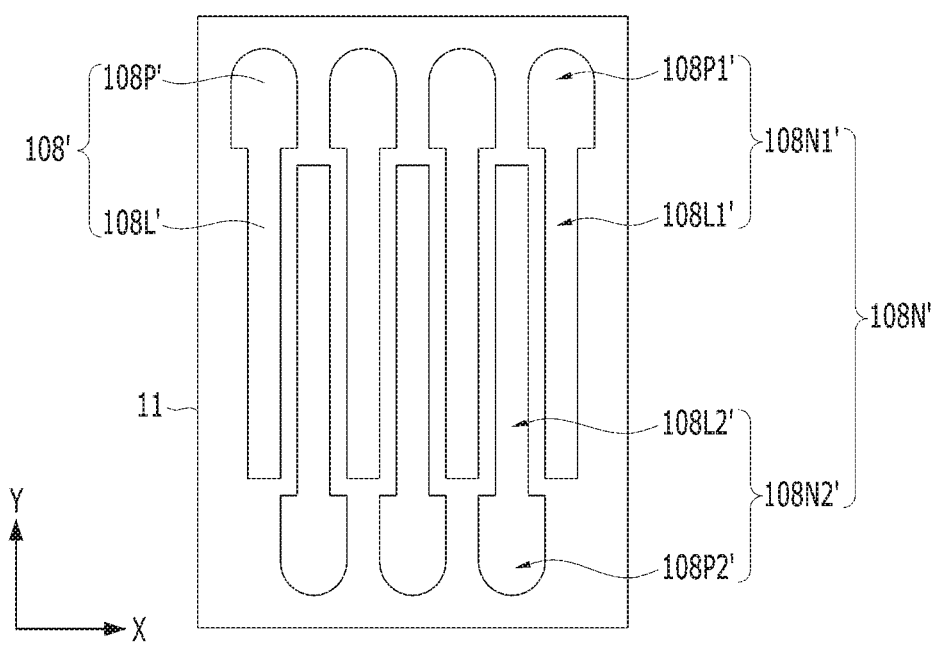

For example, referring to FIG. 2C, the spacer 106' may be formed on the sidewall of the first hard mask pattern 104M'. The spacer 106' may surround the first hard mask pattern 104M'. The spacer 106' may include a material having an etch selectivity with is respect to the first hard mask pattern 104M'. For forming the spacer 106', first an oxide layer may be formed over the first hard mask pattern 104M', and then the oxide layer may be etched back. As a result, a spacer 106' surrounding the sidewall of the first hard mask pattern 104M' may be formed. The spacer 106' may not overlap with the first and second pad portions 103P1 and 103P2 of the preliminary pattern 103. The spacer 106' may have form of a closed loop. After the spacer 106' is formed, the second hard mask pattern 107M' is formed. The second hard mask pattern 107M' may include a second line portion 107L' and a second blocking portion 107B'. The second hard mask pattern 107M' may include a plurality of second line portions 107L'. The second line portions 107L' may be coupled to one second blocking portion 107B'. The second blocking portion 107B' may extend in the second direction X. The second pad portions 103P2 may be covered with the second blocking portion 107B'. The second line portions 107L' may not overlap with the second pad portions 103P2. Each of the second line portions 107L' may have the same size. The second line portion 107L' may be formed repeatedly and alternately along the second direction X. The second line portions 107L' may protrude from the second blocking portion 107B' in the first direction Y. The second line portions 107L' may extend in the first direction Y from the second blocking portion 107B'. The second line portions 107L' may be arrayed in parallel at a predetermined distance from each other along the second direction X. The second line portions 107L' may have a line shape. The second line portions 107L' may extend in the first direction Y. The second line portions 107L' may be coupled to each other through one second blocking portion 107".

The second line portions 107L' and the second blocking portion 107B' may be integrally coupled to form a comb-shaped pattern. In some embodiments, the second hard mask pattern 107M' may be referred to as 'a second comb-shape hard mask pattern'.

According to the above description, a hybrid hard mask pattern may be formed. The hybrid hard mask pattern may include a first hard mask pattern 104M' and a second hard mask pattern 107M'. The hybrid hard mask pattern may further include a spacer 106'. The spacer 106' may have an etch selectivity with respect to the first hard mask pattern 104M' and the second hard mask pattern 107M'. The first hard mask pattern 104M' and the second hard mask pattern 107M' may be formed of the same material. The spacer 106', the first hard mask pattern 104M', and the second hard mask pattern 107M' may be positioned at the same level. The spacer 106' may have an etch selectivity with respect to the first hard mask pattern 104M' and the second hard mask pattern 107M'. The first hard mask pattern 104M' and the second hard mask pattern 107M' may be formed of the same material. The spacer 106', the first hard mask pattern 104M', and the second hard mask pattern 107M' may have an etch selectivity different from the preliminary pattern 103.

The first line portion 104L' of the first hard mask pattern 104M' and the second line portion 107L' of the second hard mask pattern 107M' may be arrayed in parallel with each other. The spacer 106' may contact the sidewall of the second hard mask pattern 104M'. As a result, the spacer 106' may be positioned between the first hard mask pattern 104M' and the second hard mask pattern 107M'. The first line portion 104L' and the second line portion 107L' may not contact each other due to the presence of the spacer 106'. The spacer 106' may be positioned between the first line portion 104L' and the second line portion 107L'.

The first hard mask pattern 104M', the spacer 106', and the second hard mask pattern 107M' may fully cover the preliminary pattern 103. The first blocking portion 104B' may cover the first pad portion 103P1. The second blocking portion 107B' may cover the second pad portion 103P2. The first line portion 104L', the second line portion 107L', and the spacer 106' may cover the plate portion 103C of the preliminary pattern 103.

Subsequently, an opening may be formed after the spacer is removed according to the same method illustrated in FIGS. 1I and 1I. For example, referring to FIG. 2D, the spacer 106' may be removed to form the opening 106S'. The opening 106S' may be defined between the first hard mask pattern 104M' and the second hard mask pattern 107M'. The opening 106S' may have a wave shape. The plate portion 103C of the preliminary pattern 103 may be exposed in a wave shape due to the opening 106S'. Differently from what is shown in the first embodiment, the edges of the first pad portion 103P1 and the second pad portion 103P2 may not be exposed by the opening 106S'.

Subsequently, a plurality of fine patterns 108' may be formed in the same method shown in FIGS. 1J and 1K. For example, referring to FIG. 2E, a plurality of fine patterns 108' may be formed by using the first hard mask pattern 104M' and the second hard mask pattern 107M' as an etch barrier and etching the preliminary pattern 103. For example, portions of the preliminary pattern 103 exposed by the opening 106S' may be etched. The plate portion 103C of the preliminary pattern 103 may be etched, and the first pad portion 103P1 and the second pad portion 103P2 may not be etched.

After the fine pattern 108' is formed, the first hard mask pattern 104M and the second hard mask pattern 107M may be removed.

Each of the fine patterns 108' may include a line pattern portion 108L'. The line pattern portion 108L' may be formed by etching the plate portion 103C. While the line pattern portion 108L' is formed, the first pad portion 103P1 and the second pad portion 103P2 may not be etched. The first pad portion 103P1 and the second pad portion 103P2 may not be etched due to the presence of the first and second blocking portion 104B' and 107B'. The remaining first pad portion 103P1 and second pad portion 103P2 which are left behind without being etched may be referred to as 'pad portions 108P'.

The pattern pair 108N' of adjacent neighboring patterns in the second direction X may be asymmetric. The pattern pair 108N' may include a first neighboring pattern 108N1' and a second neighboring pattern 108N2'. The first neighboring pattern 108N1' may include a first pad portion 108P1'. The second neighboring pattern 108N2' may include a second pad portion 108P2'. The first neighboring pattern 108N1' and the second neighboring pattern 108N2' may be asymmetric.

The first neighboring pattern 108N1' may include a first line pattern portion 108L1' and a first pad portion 108P1'. The second neighboring pattern 108N2' may include a second line pattern portion 108L2' and a second pad portion 108P2'. The first line pattern portion 108L1' and the second line pattern portion 108L2' may extend in the first direction Y, individually. The first line pattern portion 108L1' and the second line pattern portion 108L2' may be arrayed in parallel. The first line pattern portion 108L1' may have the same shape as the first line portion 104L' of the first hard mask pattern 104M'. The second line pattern portion 108L2' may have the same shape as the second line portion 107L' of the second hard mask pattern 107M'.

The first pad portion 108P1' may be coupled to one end of the first line pattern portion 108L1'. The coupling portion of the first line pattern portion 108L1' and the first pad portion 108P1' may be orthogonal. The first line pattern portion 108L1' and the first pad portion 108P1' may form an integral part. The second pad portion 108P2' may be coupled to one end of the second line pattern portion 108L2'. The coupling portion of the second line pattern portion 108L2' and the second pad portion 108P2' may be orthogonal. The second line pattern portion 108L2' and the second pad portion 108P2' may form an integral part. The first pad portion 108P1' and the second pad portion 108P2' may not be adjacent to each other.

The first pad portion 108P1' and the second pad portion 108P2' may be formed before the first line pattern portion 108L1' and the second line pattern portion 108L2' are formed. The first line pattern portion 108L1' and the second line pattern portion 108L2' may be formed at the same time. In other words, the first hard mask pattern 104M' and the second hard mask pattern 107M' may be concurrently formed through a one-time etch process. Accordingly, the mask and the etching processes may be simplified. The first and second pad portions 108P1' and 108P2' may have a wider line width than the first and second line pattern portions 108L1' and 108L2'. The first and second pad portions 108P1' and 108P2' may have a larger area than the first and second pad portions 108P1 and 108P2 of FIG. 1K.

As described above, since the first and second pad portions 108P1' and 108P2' are formed before the line pattern portion 108L' is formed, the patterning process may be simplified substantially.

As described above, according to the first embodiment of the present invention and its modified example, the sizes of the pad portion 108P and the pad 102P may be readily adjusted by modifying the first hard mask pattern 104M and 104M' and the second hard mask pattern 107M and 107M'. Therefore, the bridge margin between the neighboring fine patterns may be improved.

FIGS. 3A to 3G are plan views illustrating a method for forming a pattern of a semiconductor device in accordance with a second embodiment of the present invention. The method for forming a pattern of the semiconductor device according to the second embodiment of the present invention may be similar to that of FIGS. 1A to 1K.

First, a preliminary pattern 103 may be formed according to the method shown in FIGS. 1A to 1C. The preliminary pattern 103 may be formed over the substrate 11. The preliminary pattern 103 may include a plate portion 103C, a plurality of first pad portions 103P1, and a plurality of second pad portions 103P2. The plate portion 103C may include a first end 103E1 and a second end 103E2.

Figure 3A:
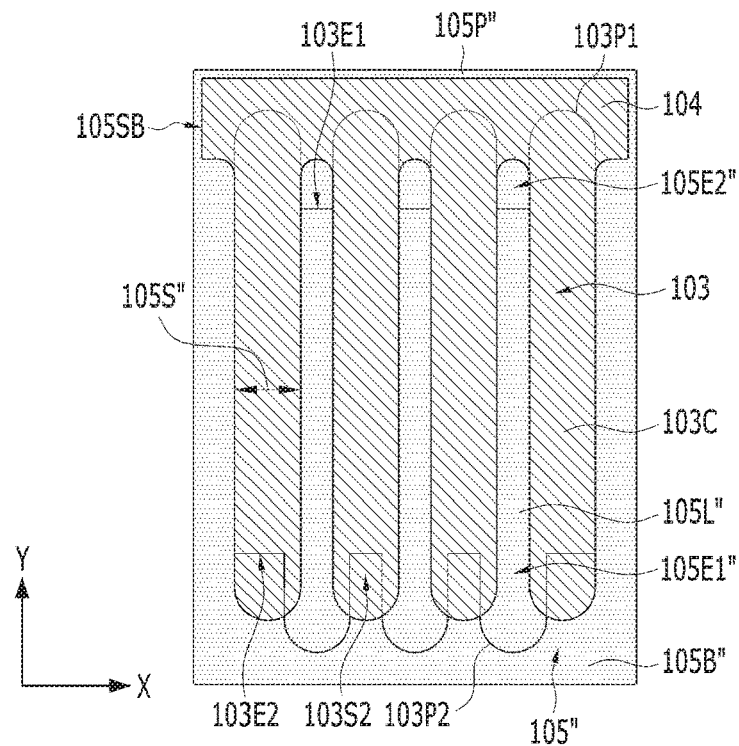
FIGS. 3A to 3G are plan views illustrating a method for forming a pattern of a semiconductor device in accordance with an embodiment of the present invention.

Subsequently, a first hard mask layer 104 may be formed over the preliminary pattern 103, as illustrated in FIG. 3A. A partition mask 105" may be formed over the first hard mask layer 104.

"The partition mask 105" may include a body portion 105B" and a plurality of line defining portions 105L". A plurality of line spacings 105S" may be formed between the line defining portions 105L". A plurality of line defining portions 105L" may be coupled to the body portion 105B". The body portion 105B" may extend in the second direction X.

The line spacings 105S" and a portion of the preliminary pattern 103 may overlap with each other. Most of each of the second pad portions 103P2 may be covered with the body portion 105B". For example, the body portion 105B" may totally cover the curved edge of each of the second pad portions 103P2 each second pad portion 103P2. The first pad portion 103P1 and the partition mask 105" may not overlap with each other.

Each of the line defining portions 105L" may have the same size. The line spacings 105S" may have the same size. The line defining portions 105L" and the line spacings 105S" may be alternately and repeatedly formed along the second direction X.

The line defining portions 105L" may protrude from the body portion 105B" in the first direction Y. The line defining portions 105L" may extend in the first direction Y from the body portion 105B". The line defining portions 105L" may be arrayed in parallel at a predetermined distance from each other along the second direction X. The plate portion 103C of the preliminary pattern 103 may be partially exposed by the line defining portions 105L". The line defining portions 105L" may partially overlap with the plate portion 103C of the preliminary pattern 103. A portion of the plate portion 103C of the preliminary pattern 103 may be covered with the line defining portions 105L", and another portion of the plate portion 103C of the preliminary pattern 103 may partially overlap with line spacings 105S'".

The partition mask 105 in FIG. 1D and the partition mask 105" in FIG. 3A may have different shapes. For example, the partition mask 105" may be a reverse shape of the partition mask 105. The partition mask 105 may be formed by using a positive photoresist, and the partition mask 105" may be formed by using a negative photoresist. The partition mask 105" may further include a dummy line 105P" which is adjacent to the first pad 103P1. The dummy line 105P" may be coupled to the line defining portion 105L". The dummy line 105P" may be spaced apart from the first pad portion 103P1, i.e., the dummy line 105P" may not contact the first pad portion 103P1. A spacing body portion 105SB may be defined between the dummy line 105P" and the line spacing 105S". The spacing body portion 105SB may extend in the second direction X. The spacing body portion 105SB may substantially overlap with the first pad portion 103P1. The line spacing 105S" and the spacing body portion 105SB may be a comb-like opening and may expose the first hard mask layer 104 in a comb-like shape.

The line defining portion 105L" and the second pad portion 103P2 may partially overlap with each other. A portion of the second pad portion 103P2 may not overlap with the body portion 105B". The coupling portion of the body portion 105B" and the line defining portion 105L" may be curved or rounded. A portion of the second pad portion 103P2 may not overlap with the rounded coupling portion. The first pad portion 103P1 may not overlap by the body portion 105B" and the line defining portion 105L". The end of the line defining portion 105L" may not overlap with the first pad portion 103P1.

From the perspective of a plan view, the end of the line defining portion 105L" may be extended to go out of the end of the plate portion 103C. The line defining portion 105L" may include a first end 105E1" and a second end 105E2". The second end 105E2" of the line defining portion 105L" may be extended to be positioned outside the first end 103E1 of the plate portion 103C. The first end 105E1" of the line defining portion 105L" may be extended to be positioned over the second pad portion 103P2.

Figure 3B:
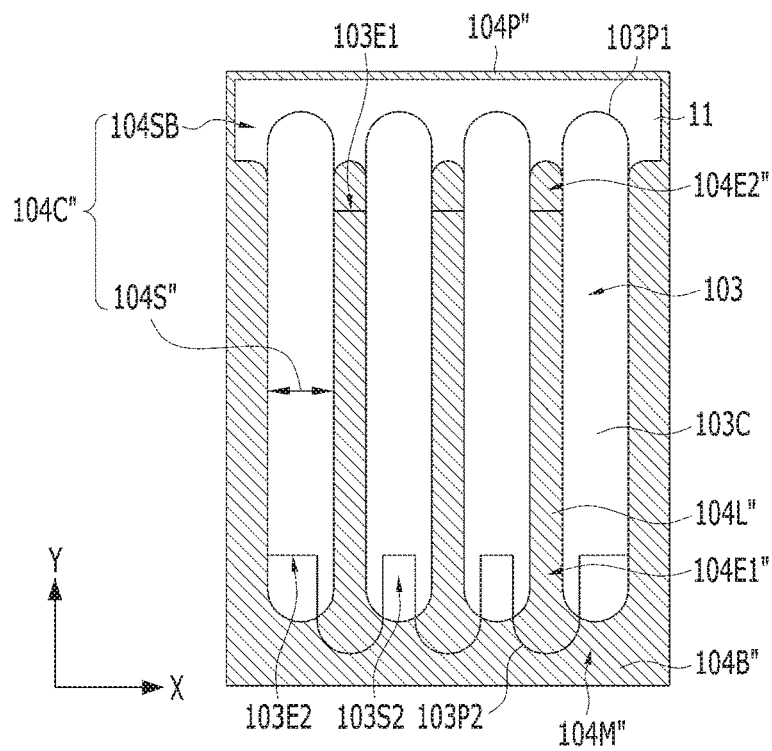

Referring to FIG. 3B, a first hard mask pattern 104M" may be formed. The first hard mask pattern 104M" may be formed by using the partition mask 105" as an etch barrier and etching the hard mask layer 104.

After the first hard mask pattern 104M" is formed, the partition mask 105" may be removed. The first hard mask pattern 104M" may have the same shape as the partition mask 105".

The first hard mask pattern 104M" may include a first line portion 104L" and a first blocking portion 104B". The first hard mask pattern 104M" may include a plurality of first line portions 104L". A plurality of spacings 104S" may be formed between the first line portions 104L". The first line portions 104L" may be coupled to one first blocking portion 104B". The first blocking portion 104B" may extend in the second direction X.

A portion of the preliminary pattern 103 may be exposed by the spacings 104S". Most of each of the second pad portions 103P2 may be covered with the first line portion 104L" and the first blocking portion 104B". The first hard mask pattern 104M" may not cover the first pad portion 103P1.

Each of the first line portions 104L" may have the same size. Each of the spacings 104S" may have the same size. The first line portion 104L" and the spacings 104S" may be alternately and repeatedly formed along the second direction X. The first line portion 104L" and the spacings 104S" may be alternately arrayed along the second direction X.

The first line portion 104L" may protrude from the first blocking portion 104B" in the first direction Y. The first line portion 104L" may extend in the first direction Y from the first blocking portion 104B". The first line portions 104L" may be arrayed in parallel at a predetermined distance from each other along the second direction X.

The plate portion 103C of the preliminary pattern 103 may be partially exposed by the first line portion 104L". The first line portion 104L" may partially overlap with the plate portion 103C of the preliminary pattern 103. A portion of the plate portion 103C of the preliminary pattern 103 may be covered with the first line portion 104L", and another portion of the plate portion 103C of the preliminary pattern 103 may be exposed by the spacings 104S". The second pad spacing 103S2 of the preliminary pattern 103 may be partially exposed by the spacings 104S".

A portion of the second pad portion 103P2 may be exposed by the first line portion 104L". A portion of the second pad portion 103P2 may be exposed by the first blocking portion 104B". The first pad portions 103P1 may not be covered with the first blocking portion 104B" and the first line portions 104L". The ends of the first line portions 104L" may not cover the first pad portions 103P2.

Each first line portion 104L" may include a first end 104E1" and a second end 104E2". The second end 104E2" of the first line portions 104L" may be extended to be positioned in the outside of the first end 103E1 of the plate portion 103C. The first end 104E1" of the first line portion 104L" may be extended to be positioned over the second pad portion 103P2.

The first line portions 104L" may each have a line shape. The first line portions 104L" may each extend in the first direction Y. The first line portions 104L" may be coupled to each other through the first blocking portion 104B".

The first line portions 104L" and the first blocking portion 104B" may be integrally coupled to form a comb-shape pattern. In some embodiments, the first hard mask pattern 104M" may be referred to as 'a first comb-shape hard mask pattern'.

The first hard mask pattern 104M" may further include a dummy blocking line 104P''' which is adjacent to but spaced apart from the first pad portions 103P1. In other words, the dummy blocking line 104P''' may not contact the first pad portions 103P1. The dummy blocking line 104P''' may be coupled to the first line portions 104L". A spacing body portion 104SB may be defined between the dummy blocking line 104P''' and the spacings 104S". The spacing body portion 104SB may have a shape that is extended in the second direction X. The spacing body portion 104SB may overlap with most of each of the first pad portions 103P1. The spacings 104S" and the spacing body portion 104SB may be a comb-shaped opening 104C". The comb-shaped opening 104C" may expose the preliminary pattern 104 in a comb-like shape.

As described above, the first hard mask pattern 104M" may include a first blocking portion 104B", a first line portion 104L", and a comb-shaped opening 104C". The second pad portions 103P2 of the preliminary pattern 103 may be covered with the first blocking portion 104B". The comb-shaped opening 104C" may expose the plurality of first pad portions 103P1 simultaneously. The plate portion 103C may be partially exposed by the first line portions 104L" and the comb-shaped opening 104C". For example, the plate portion 103C of the is preliminary pattern 103 may be regularly exposed by the plurality of spacings 104S".

Figure 3C:
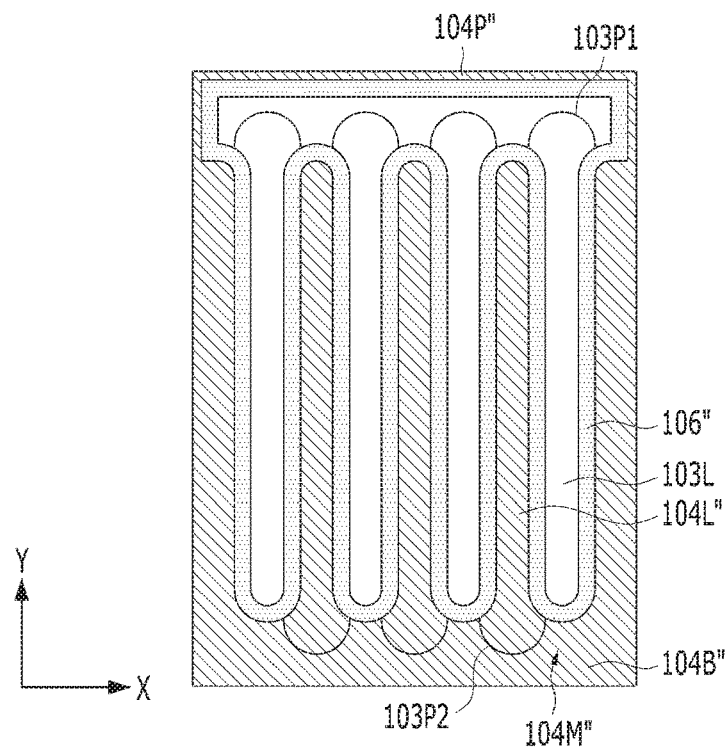

Referring to FIG. 3C, spacers 106" may be formed. The spacers 106" may be formed on the sidewalls of the first hard mask pattern 104M". For example, the spacers 106" may be formed on the sidewalls of the comb-shaped opening 104C". The spacers 106" may include a material having an etch selectivity with respect to the first hard mask pattern 104M". The spacers 106" may be formed by forming an oxide layer over the first hard mask pattern 104M" and performing an etch-back process onto the oxide layer. As a result, spacers 106" which surrounds the sidewalls of the first hard mask pattern 104M" may be formed. The portions of the preliminary pattern 103 may be exposed by the spacers 106" and the first hard mask pattern 104M". For example, a portion of the plate portion 103C of the preliminary pattern 103 and the first pad portion 103P1 may be exposed.

The spacers 106" may have a shape of a closed loop.

Figure 3D:
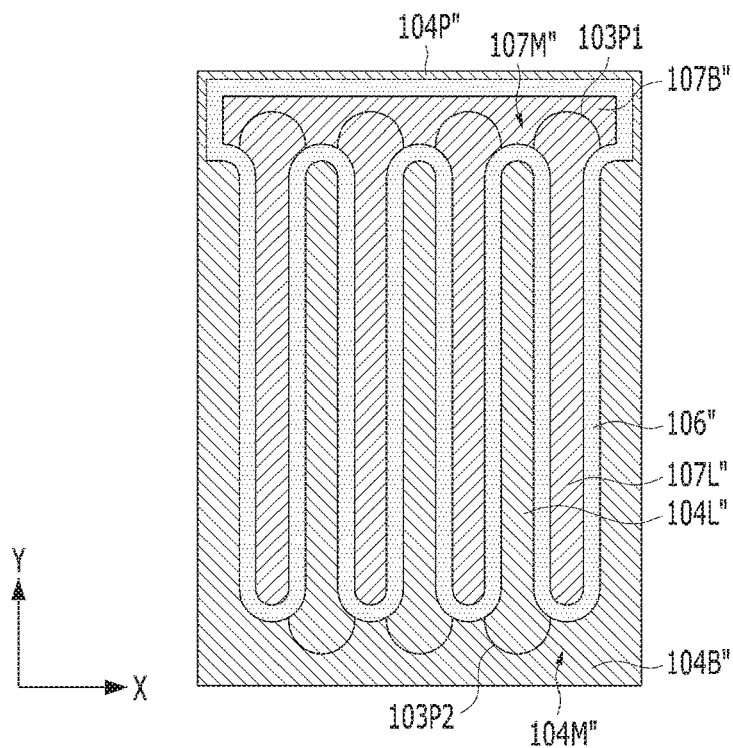

A second hard mask pattern 107M" may be formed, as shown in FIG. 3D. The second hard mask pattern 107M" may be made of a material having an etch selectivity with respect to the preliminary pattern 103. To form the second hard mask pattern 107M", an etch-back process or a Chemical Mechanical Polishing may be performed after the second hard mask layer is formed (see FIGS. 1G and 1H). The second hard mask layer 107M" and the first hard mask pattern 104M" may be formed of the same material. The second hard mask pattern 107M" and the spacers 106" may fill the comb-shaped opening 104C".

The second hard mask pattern 107M" may include a plurality of second line portions 107L" and a second blocking portion 107B". The second line portions 107L" may be coupled to the second blocking portion 107B". The second blocking portion 107B" may extend in the second direction X.

The first pad portion 103P1 may be covered with respective second line portions 107L" and the second blocking portion 107B".

Each of the second line portions 107L" may have the same size. The second line portions 107L" may be alternately and repeatedly formed along the second direction X.

The second line portions 107L" may protrude from the second blocking portion 107B" in the first direction Y. The second line portions 107L" may extend in the first direction Y from the second blocking portion 107B". The second line portions 107L" may be arrayed in parallel at a predetermined distance from each other along the second direction X.

The second line portions 107L" may each be formed in a line shape. The second line portions 107L" may each extend in the first direction Y. The second line portions 107L" may be coupled to each other through the second blocking portion 107B".

The second line portions 107L" and the second blocking portion 107B" may be integrally coupled to form a comb-shaped pattern. In some embodiments, the second hard mask pattern 107M" may be referred to as 'a second comb-shaped hard mask pattern'.

According to the above description, a hybrid hard mask pattern may be formed. The hybrid hard mask pattern may include a first hard mask pattern 104M" and a second hard mask pattern 107M". The hybrid hard mask pattern may further include spacer 106". The spacer 106", the first hard mask pattern 104M", and the second hard mask pattern 107M" may be positioned at the same level. The spacer 106" may have an etch selectivity with respect to the first hard mask pattern 104M" and the second hard mask pattern 107M". The first hard mask pattern 104M" and the second hard mask pattern 107M" may be formed of the same material. The spacer 106", the first hard mask pattern 104M", and a second hard mask pattern 107M" may have an etch selectivity with respect to the preliminary pattern 103.

The first line portions 104L" of the first hard mask pattern 104M" and the second line portions 107L" of the second hard mask pattern 107M" may be arrayed in parallel with each other. The spacer 106" may contact the sidewall of the first hard mask pattern 104M". Thus, the spacers 106" may be positioned between the first hard mask pattern 104M" and the second hard mask pattern 107M". The first line portions 104L" and the second line portions 107L" may not contact each other because of the spacers 106". The spacers 106" may be positioned between the first line portions 104L" and the second line portions 107L".

The first hard mask pattern 104M", the spacers 106", and the second hard mask pattern 107M" may fully cover the preliminary pattern 103. The first blocking portion 104B" and the first line portions 104L" may cover the second pad portions 103P2. The second blocking portion 1073" and the second line portions 107L" may cover the first pad portions 103P1. The first line portions 104L", the second line portions 107L", and the spacers 106" may fully cover the plate portion 103C of the preliminary pattern 103.

Figure 3E:
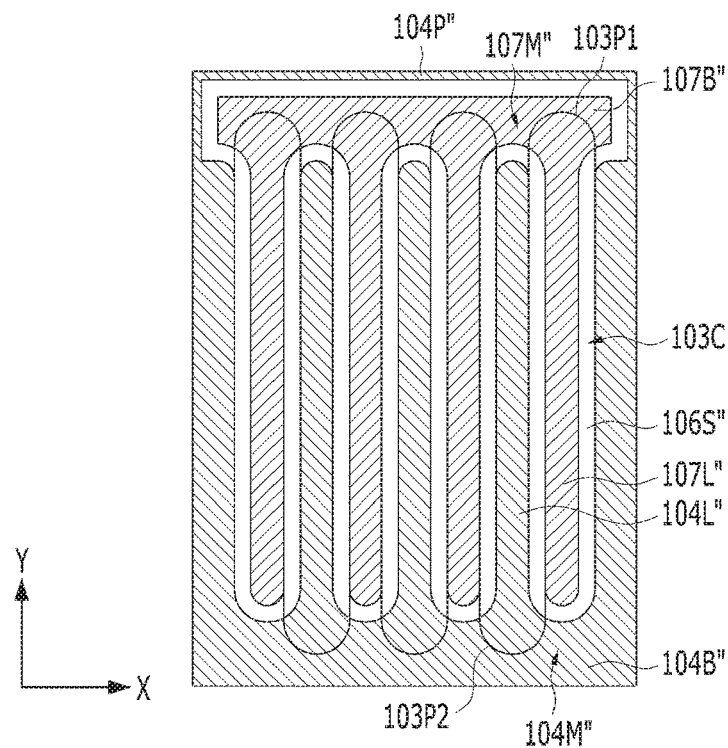

The spacer 106" may be removed, as shown in FIG. 3E. Thus, an opening 106S" may be formed. The opening 106S" may be defined between the first hard mask pattern 104M" and the second hard mask pattern 107M". The opening 106S" may have a shape that surrounds the sidewalls of the second hard mask pattern 107M".

The opening 106S" may be a wave shape. A portion of the preliminary pattern 103" may be exposed by the opening 106S". For example, the opening 106S" may expose the plate portion 103C of the preliminary pattern 103 in the wave shape. In addition, the opening 106S" may partially expose the edges on both sides of the first pad portion 103P1 and the second pad portion 103P2.

Figure 3F:
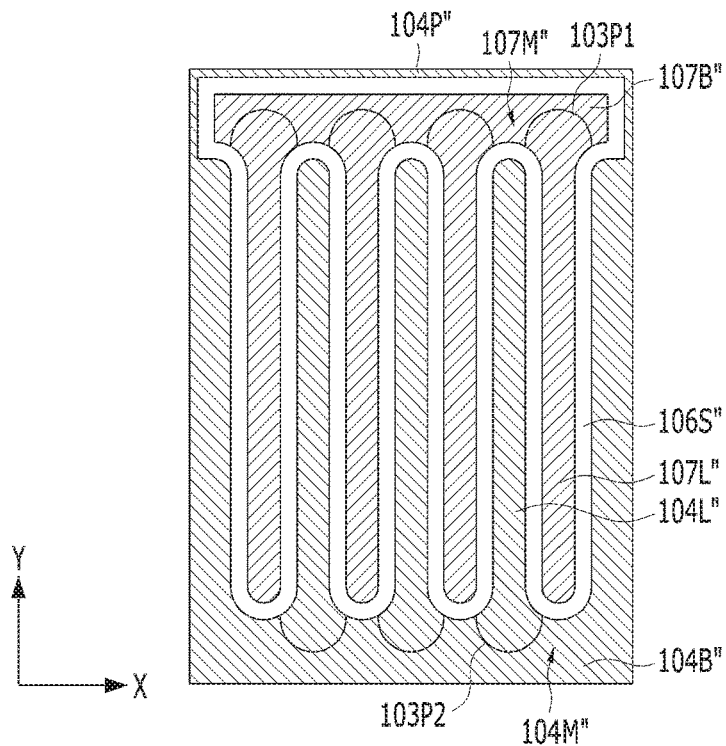
Figure 3G:
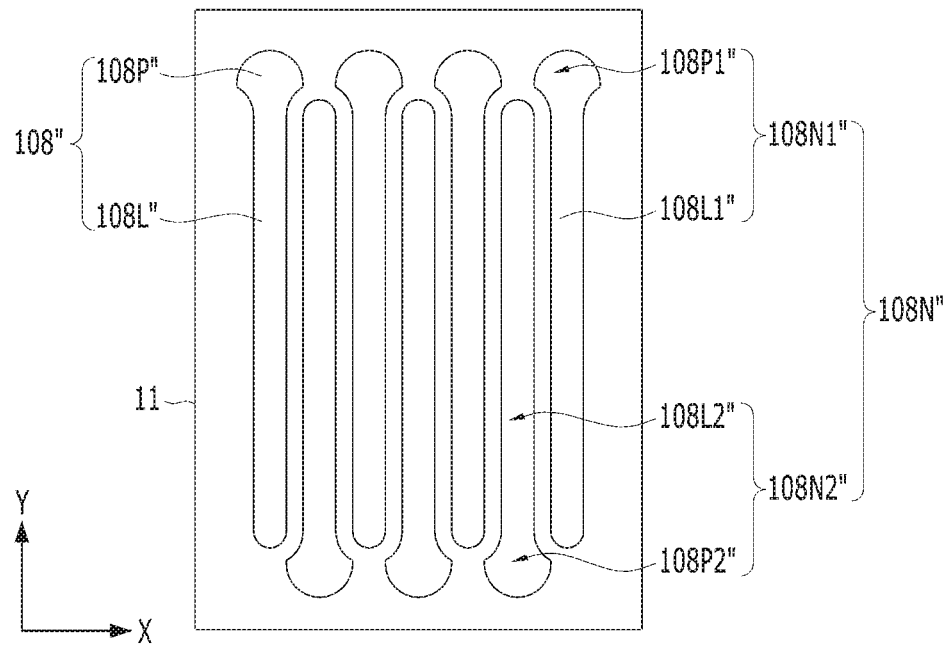

As shown in FIGS. 3F and 3G, a plurality of fine patterns 108 may be formed.

Referring to FIG. 3F, to form a plurality of fine patterns 108", the first hard mask pattern 104M and the second hard mask pattern 107M may be used as an etch barrier to etch the preliminary pattern 103. For example, the portions of the preliminary pattern 103 that are exposed by the opening 106S" may be etched.

Referring to FIG. 3G, the first hard mask pattern 104M" and the second hard mask pattern 107M" may be removed. The line pattern portion 108L" may be formed by etching the plate portion 103C. The first and second pad portions 103P1 and 103P2 may be etched at their edges to remain as a pad portion 108P". The fine patterns 108" may include a line pattern portion 108L" and a pad portion 108P", individually. The pad portion 108P" may include first pad and second pad portions 108P1" and 108P2". The first pad portions 108P1" may be formed by etching the first pad portions 103P1, and the second pad portions 108P2" may be formed by etching the second pad portions 103P2.

Each of the fine patterns 108" may include the line pattern portions 108L" and the pad portions 108P". The fine pattern 108" may have an asymmetric structure in which the pad portion 108P" is formed on one end of the line pattern portion 108L". The pad portions 108P" may not be formed on the same straight line in the first direction Y. Therefore, the pad portions 108P" may be alternately and repeatedly formed along the second direction X. In other words, the adjacent pad portions 108P" may be disposed in a is zigzag manner along the second direction X.

A pattern pair 108N" disposed adjacent in the second direction X may be asymmetric. The pattern pair 108N" may include a first neighboring pattern 108N1" and a second neighboring pattern 108N2". The first neighboring pattern 108N1" may include a first pad portion 108P1". The second neighboring pattern 108N2" may include a second pad portion 108P2". The first neighboring pattern 108N1" and the second neighboring pattern 108N2" may be asymmetric.

The first neighboring pattern 108N1" may include a first line pattern portion 108L1" and a first pad portion 108P1". The second neighboring pattern 108N2" may include a second line pattern portion 108L2" and a second pad portion 108P2". The first line pattern portion 108L1" and the second line pattern portion 108L2" may extend in the first direction Y, individually. The first line pattern portion 108L1" and the second line pattern portion 108L2" may be arrayed in parallel. The first line pattern portion 108L1" may have the same shape as the second hard mask pattern 107M" and the second line portion 107L". The second line pattern portion 108L2" may have the same shape as the first line portion 104L" of the first hard mask pattern 104M".

The first pad portion 108P1" may be coupled to one end of the first line pattern portion 108L1". The coupling portion of the first line pattern portion 108L1" and the first pad portion 108P1" may be curved or rounded. The first line pattern portion 108L1" and the first pad portion 108P1" may form an integral part. The second pad portion 108P2" may be coupled to one end of the second line pattern portion 108L2". The coupling portion of the second line pattern portion 108L2" and the second pad portion 108P2" may be curved or rounded. The second line pattern portion 108L2" and the second pad portion 108P2" may form an integral part. The first pad portion 108P1" and the second pad portion 108P2" may not be adjacent to each other.

The first line pattern portion 108L1" and the second line pattern portion 108L2" may be formed at the same time. In other words, the first line pattern portion 108L1" and the second line pattern portion 108L2" may be formed simultaneously through a one-time etch process using the first hard mask pattern 104M" and the second hard mask pattern 107M". Accordingly, the mask and the etching processes may be simplified. The first and second pad portions 108P1" and 108P2" may have a wider line width than the first and second line pattern portions 108L1" and 108L2". The first and second pad portions 108P1" and 108P2" may have a curved or rounded shape such as, for example, a convex or a ball shape.

The process may be simplified by simultaneously forming the line pattern portion 108L" and the pad portion 108P".

Since the line pattern portion 108L" is formed through the opening 106S" between the first hard mask pattern 104M" and the second hard mask pattern 107M", no additional cutting mask may be required.

The second embodiment may be modified by the method illustrated in FIGS. 2A to 2E.

The method of forming a fine pattern by using a hybrid hard mask pattern in accordance with the present embodiment may be applied to a DRAM. For example, the present invention may be applied to a gate electrode forming process and a bit line forming process. The fine pattern 108, 108' and 108" may include a bit line. Thus, the line and pad portions of a bit line may be easily formed.

Figure 4:
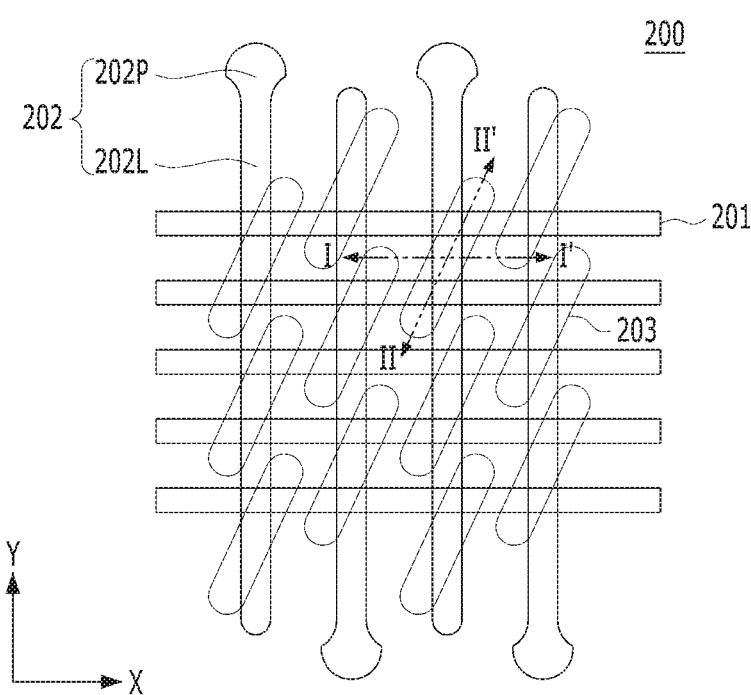
FIG. 4 illustrates a semiconductor device in accordance with an embodiment of the present invention.

FIG. 4 is a plan view illustrating a semiconductor device in accordance with a third embodiment of the present invention. The third embodiment may describe a semiconductor device having a memory cell such as a DRAM and the like.

The semiconductor device 200 may include a plurality of memory cells. The semiconductor device 200 may include a buried word line 201 and bit line 202. The buried word line 201 may have a linear shape which is extended along in the second direction X. The bit line 202 may have a linear shape that is extended along in the first direction Y. The buried word line 201 and the bit line 202 may intersect with each other. The buried word line 201 may be formed to traverse a plurality of active regions 203 along the second direction X. The bit line 202 may be formed to traverse the active regions 203 along the first direction Y.

The bit line 202 may include a line portion 202L and a pad portion 202P.

The line portion 202L and the pad portion 202P of the bit line 202 may be formed by the pattern forming methods in accordance with the first embodiment, the modified example of the first embodiment, the second embodiment, and the modified example of the second embodiment of the present invention. The line portion 202L of the bit line 202 may correspond to the line pattern portions 108L, 108L' and 108L". The pad portion 202P of the bit line 202 may correspond to the pad portions 108P, 108P' and 108P".

FIGS. 5A to 5H are cross-sectional views illustrating a method for fabricating the semiconductor device 200 shown in FIG. 4. FIGS. 5A to 5H are cross-sectional views taken along a I-I' direction and a II-II' direction shown in FIG. 4.

Figure 5A:
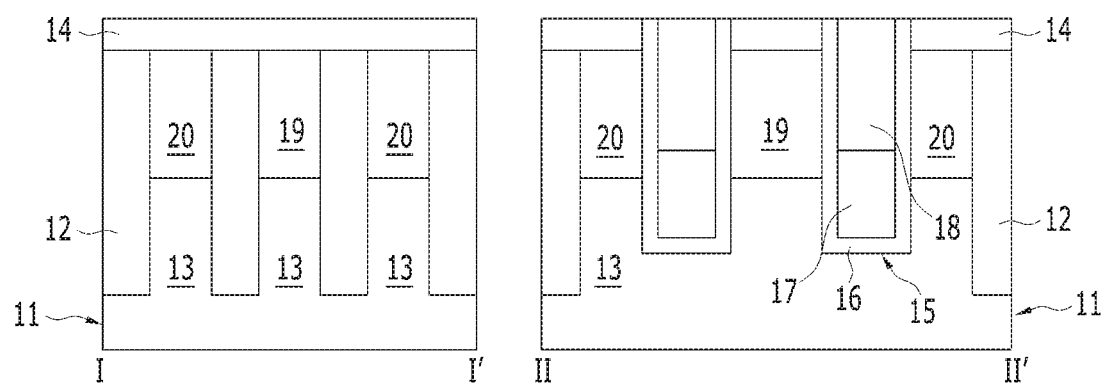
FIGS. 5A to 5H are cross-sectional views illustrating a method for fabricating a semiconductor device in accordance with an embodiment of the present invention.

Referring to FIG. 5A, an isolation layer 12 may be formed over the substrate 11. An active region 13 may be defined by the isolation layer 12. The isolation layer 12 may be formed by a Shallow Trench Isolation (STI) process. The STI process may be performed as follows. The substrate 11 may be etched to form an isolation trench (not shown). The isolation trench may be filled with a dielectric material, thereby forming the isolation layer 12. The isolation layer 12 may include a silicon oxide, a silicon nitride, or a combination thereof. A Chemical Vapor Deposition (CVD) process or other deposition processes may be used to fill the isolation trench 13 with a dielectric material. A planarization process such as Chemical-Mechanical Polishing (CMP) may be additionally used.

Subsequently, a buried gate structure may be formed in the inside of the substrate 11. The buried gate structure may be referred to as 'a buried word line structure'. The buried gate structure may include a gate trench 15, a gate dielectric layer 16 covering the bottom and sidewalls of the gate trench 15, a gate electrode 17 partially filling the gate trench 15 over the gate dielectric layer 16, and a gate capping layer 18 formed over the gate electrode 17.

The method of forming the buried gate structure is as follows.

First of all, a gate trench 15 may be formed in the inside of the substrate 11. The gate trench 15 may have a line shape traversing the active region 13 and the isolation layer 12.

To form the gate trench 15, the hard mask layer 14 may be used as an etch barrier. The hard mask layer 14 may correspond to the first and second hard mask patterns 104M and 107M according to the embodiment described above. The hard mask layer 14 may include a silicon oxide. The hard mask layer 14 may include TEOS. The gate trench 15 may be formed shallower than the isolation trench. That is, the bottom surface of the gate trench 15 may be positioned at a level higher than the bottom surface of the isolation layer 12. The depth of the gate trench 15 may be sufficient to increase the average cross-sectional area of the gate electrode 17. Thus, the resistance of the gate electrode 17 may be reduced. In accordance with another embodiment of the present invention, the bottom edge of the gate trench 15 may be round-shaped. By forming the gate trench 15 to have in the curved or rounded shape as described above, the prominence and depression may be minimized in the bottom portion of the gate trench 15, and the filling of the gate electrode 17 may be easily performed.

Although not illustrated, after the gate trench 15 is formed, a fin region may be formed. The fin region may be formed by recessing a portion of the isolation layer 12. The fin region may be formed by selectively removing the isolation layer 12 under the gate trench 15.

Subsequently, a gate dielectric layer 16 may be formed over the bottom surface and sidewalls of the gate trenches 15. Prior to the formation of the gate dielectric layer 16, etch damage to the surface of the gate trench 15 may be cured. For example, after a sacrificial oxide is formed by a thermal oxidation treatment, the sacrificial oxide may be removed.

The gate dielectric layer 16 may be formed by a thermal oxidation treatment. For example, the bottom and sidewalls of the gate trench 15 may be oxidized to form the gate dielectric layer 16.

In accordance with an embodiment of the present invention, the gate dielectric layer 16 may be formed by a deposition method such as Chemical Vapor Deposition (CVD) or Atomic Layer Deposition (ALD). The gate dielectric layer 16 may include a high-k material, an oxide, a nitride, an oxynitride, or a combination thereof. The high-k material may include a hafnium-containing material. The hafnium-containing material may include a hafnium oxide, a hafnium silicon oxide, a hafnium silicon oxynitride, or a combination thereof. According to another embodiment of the present invention, the high-k material may include a lanthanum oxide, a lanthanum aluminum oxide, a zirconium oxide, a zirconium silicon oxide, a zirconium silicon oxynitride, an aluminum oxide, and combinations thereof. As for the high-k material, other high-k materials known in the art may be optionally used.

In accordance with an embodiment of the present invention, the gate dielectric layer 16 may be formed by depositing a liner polysilicon layer, followed by radical oxidation of the liner polysilicon layer.

In accordance with an embodiment of the present invention, the gate dielectric layer 16 may be formed by forming the liner silicon nitride layer, followed by a radical oxidation of the liner silicon nitride layer.

Subsequently, a gate electrode 17 may be formed over the gate dielectric layer 16. In order to form the gate electrode 17, a recessing process may be performed after forming a conductive layer (not shown) to fill the gate trench 15. The recessing process may be an etch-back process, or a Chemical Mechanical Polishing (CMP) process, and an etch-back process may be sequentially performed for the recessing process. The gate electrode 17 may have a recessed shape that fills a portion of the gate trench 15. In other words, the upper surface of the gate electrode 17 may be lower than the upper surface of the active region 13. The gate electrode 17 may include a metal, a metal nitride, or a combination thereof. For example, the gate electrode 17 may be formed of a titanium nitride (TiN), tungsten (W), or a titanium nitride/tungsten (TiN/W). The titanium nitride/tungsten (TiN/W) may be a structure that conformally forms a titanium nitride and then partially fills the gate trench 15 with tungsten. As the gate electrode 17, a titanium nitride may be used alone, which may be referred to as a gate electrode 17 of a 'TIN Only' structure.

Subsequently, a gate capping layer 18 may be formed over the gate electrode 17. The gate capping layer 18 may include a dielectric material. The remaining portion of the gate trench 15 may be filled with the gate capping layer 18 over the gate electrode 17. The gate capping layer 18 may include a silicon nitride. According to another embodiment of the present invention, the gate capping layer 18 may include a silicon oxide. According to another embodiment of the present invention, the gate capping layer 18 may have a NON (Nitride-Oxide-Nitride) structure. The top surface of the gate capping layer 18 may be positioned at the same level as the top surface of the hard mask layer 14. To this end, a CMP process may be performed while the gate capping layer 18 is formed.

After the buried gate structure is formed as described above, a first impurity region 19 and a second impurity region 20 may be formed. The first impurity region 19 and the second impurity region 20 may be formed by a doping process such as an implantation. The first impurity region 19 and the second impurity region 20 may have the same depth. According to another embodiment of the present invention, the first impurity region 19 may be deeper than the second impurity region 20. The first impurity region 19 and the second impurity region 20 may be referred to as source/drain regions. The first impurity region 19 may be an area to which a bit line contact plug is to be coupled. The second impurity region 20 may be an area to which a storage node contact plug is to be coupled.

A cell transistor of the memory cell may be formed by the gate electrode 17, the first impurity region 19, and the second impurity region 20.

Figure 5B:
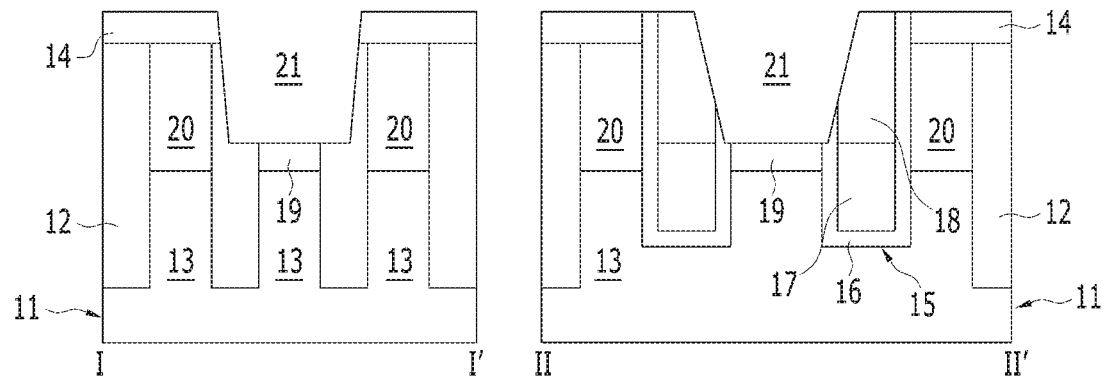

Referring to FIG. 5B, a contact hole 21 may be formed. The hard mask layer 14 may be etched by using a contact mask (not shown) to form the contact holes 21. The contact hole 21 may have a circular shape or an elliptical shape when looked from the perspective of a plan view. A portion of the substrate 11 may be exposed by the contact hole 21. The contact hole 21 may have a diameter which is controlled into a predetermined line width. The contact hole 21 may be formed to expose a portion of the active region 13. For example, the first impurity region 19 may be exposed by the contact hole 21. The contact hole 21 may have a longer diameter than a minor axis width of the active region 13. Therefore, the first impurity region 19, the isolation layer 12, and a portion of the gate capping layer 18 may be etched during an etching process for forming the contact hole 21. In other words, the gate capping layer 18, the first impurity region 19, and the isolation layer 12 under the contact hole 21 may be recessed to a predetermined depth. As a result, the bottom of the contact hole 21 may be extended into the substrate 11. As the contact hole 21 is extended, the surface of the first impurity region 19 may be recessed, and the surface of the first impurity region 19 may be positioned at a lower level than the surface of the active region 13.

Figure 5C:
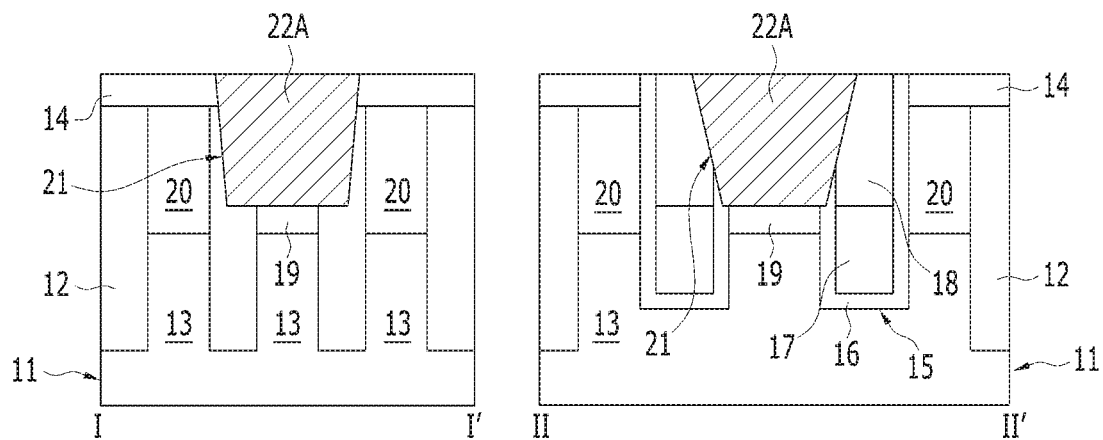

Referring to FIG. 5C, a preliminary plug 22A may be formed in the contact hole 21. The preliminary plug 22A may be formed by a Selective Epitaxial Growth (SEG). For example, the preliminary plug 22A may include a SEG SIP. In this way, the preliminary plug 22A may be formed without voids by the selective epitaxial growth. According to another embodiment of the present invention, the preliminary plug 22A may be formed by depositing a polysilicon layer and performing a CMP process. The preliminary plug 22A may fill the contact hole 21. The upper surface of the preliminary plug 22A may be positioned at the same level as the upper surface of the hard mask layer 14.

Figure 5D:
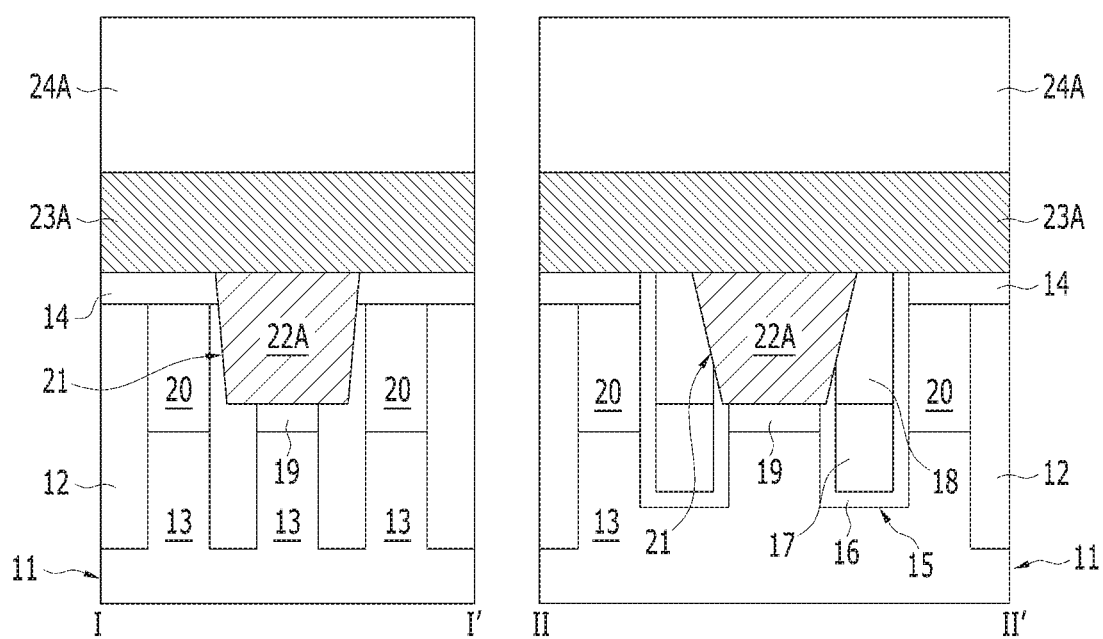

Referring to FIG. 5D, a conductive layer 23A and a capping is layer 24A may be stacked. The conductive layer 23A and the capping layer 24A may be sequentially stacked over the preliminary plug 22A and the hard mask layer 14. The conductive layer 23A may include a metal-containing material. The conductive layer 23A may include a metal, a metal nitride, a metal silicide, or a combination thereof. According to the embodiment of the present invention, the conductive layer 23A may include tungsten (W). According to another embodiment of the present invention, the conductive layer 23A may include a stacked layer of a titanium nitride and tungsten (TiN/W). Herein, the titanium nitride may serve as a barrier. The capping layer 24A may be formed of a dielectric material having an etch selectivity with respect to the conductive layer 23A and the preliminary plug 22A. The capping layer 24A may include a silicon oxide or a silicon nitride. According to the embodiment of the present invention, the capping layer 24A may be formed of a silicon nitride.

The stacked structure of the conductive layer 23A and the capping layer 24A may correspond to the etch target layer 101 of FIG. 1A.

Figure 5E:
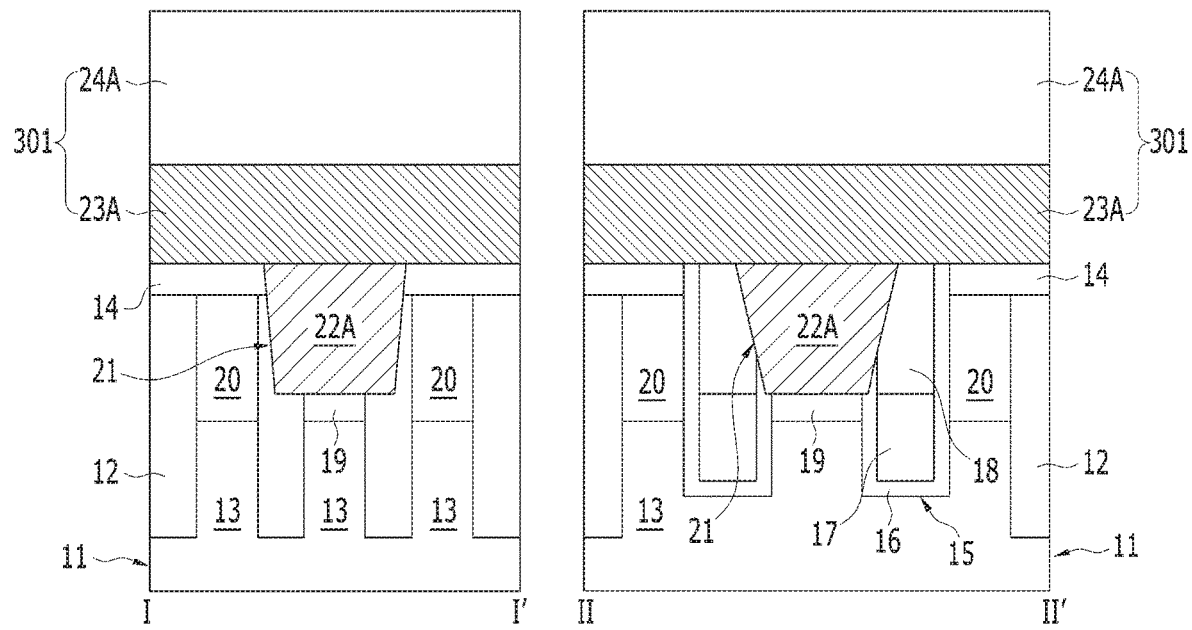

Subsequently, as shown in FIGS. 1A and 1B, the first and second pad portions 103P1 and 103P2 of the preliminary pattern 103, that is, the bit line pad portions, may be defined in advance. For example, the capping layer 24A and a portion of the conductive layer 23A may be etched to define the bit line pad portion in advance. FIG. 5E is a diagram showing a preliminary bit line pattern 301. The preliminary bit line pattern 301 may correspond to the preliminary pattern 103. The preliminary bit line pattern 301 may be pre-defined with pad portions (not shown) having the same shape as the first and second pad portions 103P1 and 103P2. To form the preliminary bit line pattern 301, the etch mask layer 102 of FIG. 1A may be used. For example, the capping layer 24A and the conductive layer 23A may be sequentially etched by using the etch mask layer 102 to form the preliminary bit line pattern 301.

Figure 5F:
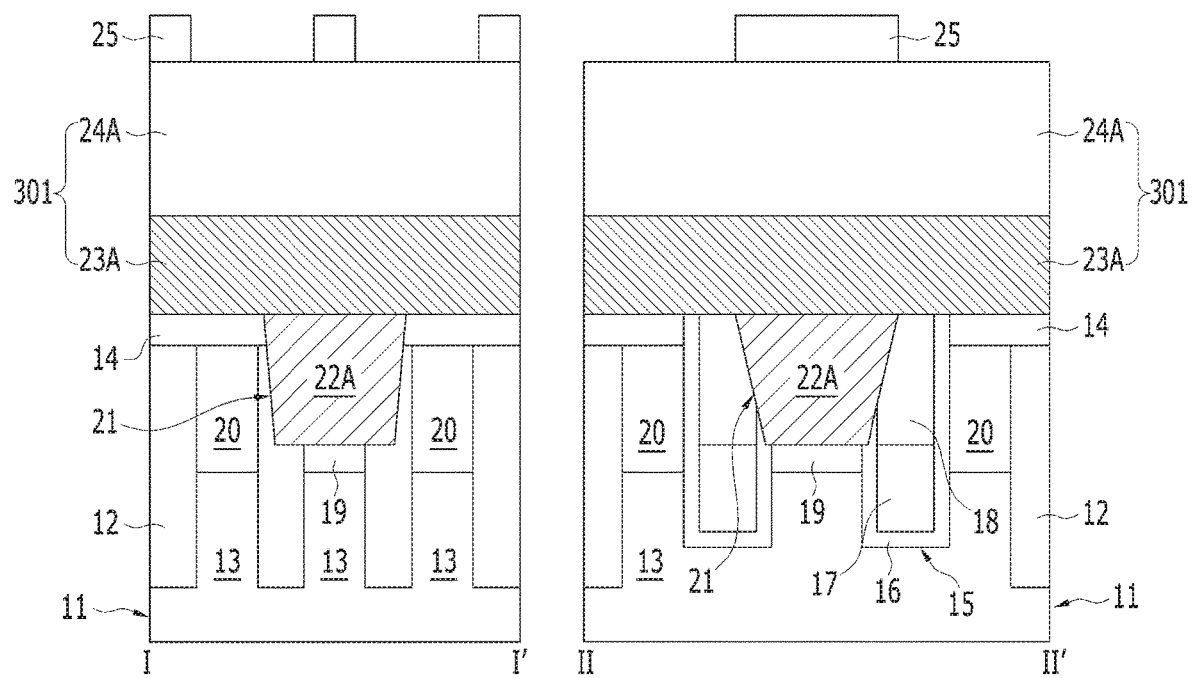

The bit line mask layer 25 may be formed over the preliminary bit line pattern 301, as shown in FIG. 5F. The bit line mask layer 25 may be formed by the method shown in FIGS. 1C to 1I. The bit line mask layer 25 may correspond to the first and second hard mask patterns 104M and 107M of FIG. 1I.

Figure 5G:
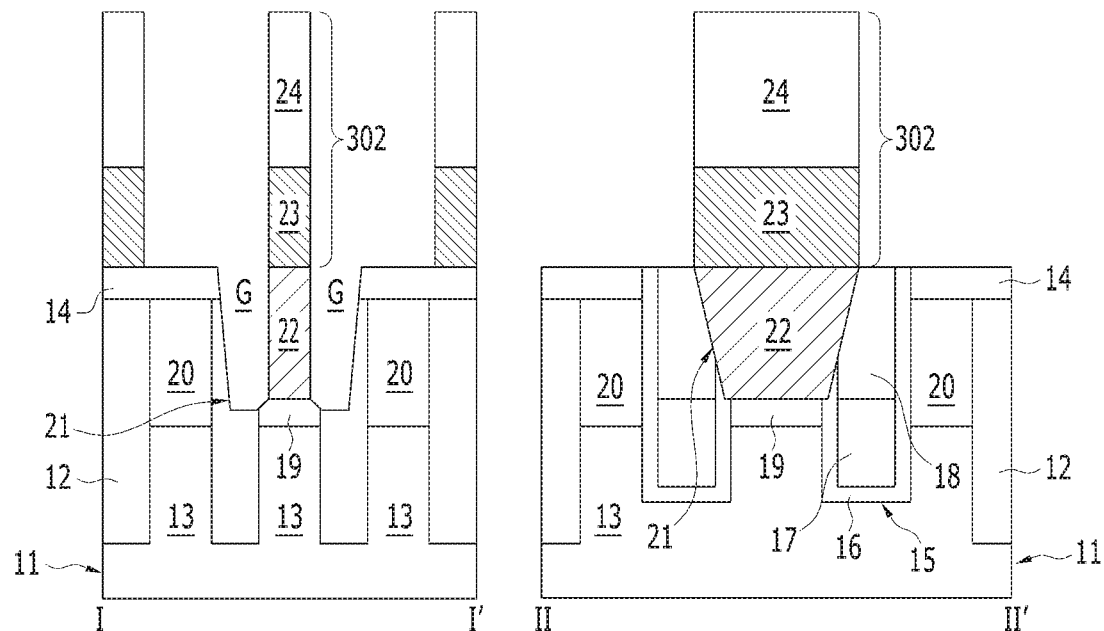

Referring to FIG. 5G, the preliminary bit line pattern 301 may be etched. As a result, the bit line 23 and the bit line contact plug 22 may be formed. The bit line 23 and the bit line contact plug 22 may be formed simultaneously. The bit line 23 and the bit line contact plug 22 may be formed by an etch process using the bit line mask layer 25.

The capping layer 24A and the conductive layer 23A may be etched by using the bit line mask layer 25 as an etch barrier. As a result, a bit line structure including the bit line 23 and the bit line capping layer 24 may be formed. The bit line 23 may be formed by etching the conductive layer 23A. The bit line capping layer 24 may be formed by etching the capping layer 24A.

Subsequently, the preliminary plug 22A may be etched with the same line width as the bit line 23. As a result, the bit line contact plug 22 may be formed. The bit line contact plug 22 may be formed over the first impurity region 19. The bit line contact plug 22 may couple the first impurity region 19 and the bit line 23 with each other. The bit line contact plug 22 may be formed in the inside of the contact hole 21. The line width of the bit line contact plug 22 may be smaller than the diameter of the contact hole 21. Therefore, a gap G may be formed around the bit line contact plug 22.

As described above, since the bit line contact plug 22 is formed, a gap G may be formed in the contact hole 21. This is because the bit line contact plug 22 is formed by being etched smaller than the diameter of the contact hole 21. The gap G may be formed independently on both sidewalls of the bit line contact plug 22 and not in a surrounding shape surrounding the bit line contact plug 22. As a result, one-bit line contact plug 22 and a pair of gaps G may be positioned in the inside of the contact hole 21, with the pair of the gaps G being separated by the bit line contact plug 22. The bottom surface of the gaps G may be extended into the interior of the isolation layer 12. In other words, the bottom surface of the gaps G may be positioned at a lower level than the recessed upper surface of the first impurity region 19.

Subsequently, the bit line mask layer 25 may be removed.

The stacked structure of the bit line contact plug 22, the bit line 23 and the bit line capping layer 24 that are stacked in the order may be referred to as a bit line structure 302. The bit line 23 may correspond to the pattern 108 of FIG. 1K.

Figure 5H:
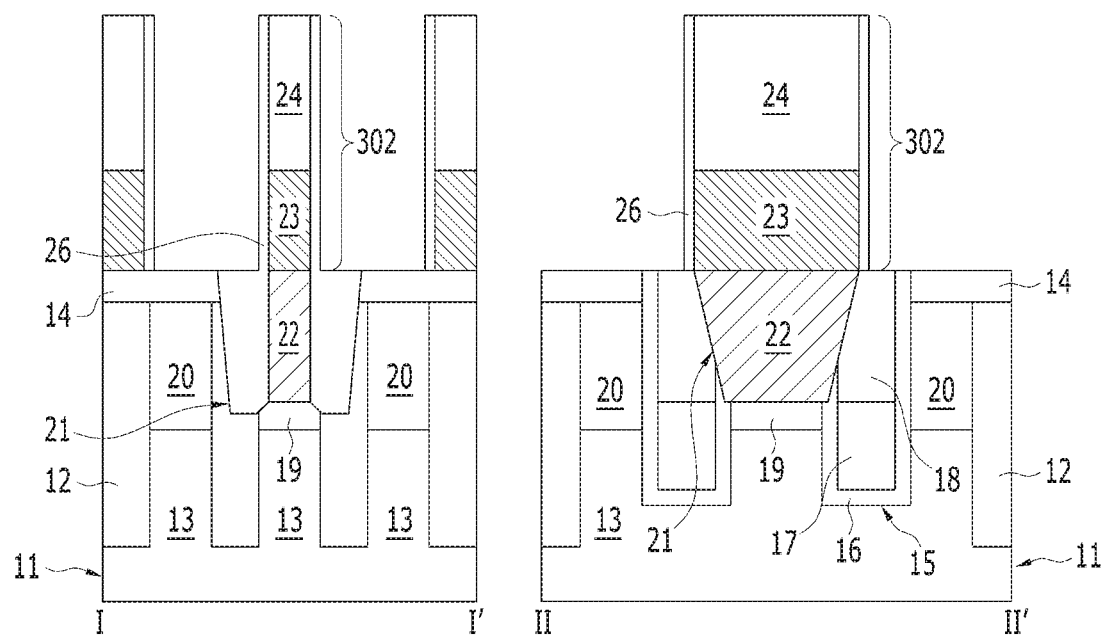

Referring to FIG. 5H, bit line spacers 26 may be formed on the sidewalls of the bit line contact plug 22, the bit line 23, and the bit line capping layer 24. The lower portion of the bit line spacer 26 may fill the gap (G in FIG. 5G).

Although not illustrated, a storage node contact plug forming process and a capacitor forming process may be sequentially performed.

According to another embodiment of the present invention, the bit line 23 described above may be formed by the method illustrated in FIGS. 2A to 2E. The bit line 23 may correspond to the pattern 108'. According to yet another embodiment of the present invention, the bit line structure 23 may be formed by the method illustrated in FIGS. 3A to 3G. The bit line 23 may correspond to the pattern 108".

Figure 6A:
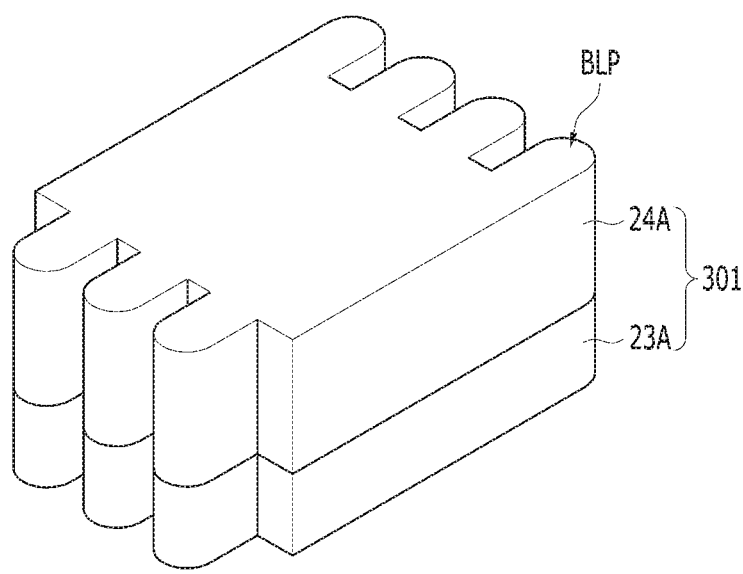
FIG. 6A is a schematic diagram illustrating a preliminary bit line pattern of FIG. 5E.

FIG. 6A is a schematic diagram illustrating a preliminary bit line pattern 301 of FIG. 5E. Referring to FIG. 6A, the preliminary bit line pattern 301 may be a stacked structure where the conductive layer 23A and the capping layer 24A are sequentially stacked. The preliminary bit line pattern 301 may include a plurality of pad portions BLP.

Figure 6B:
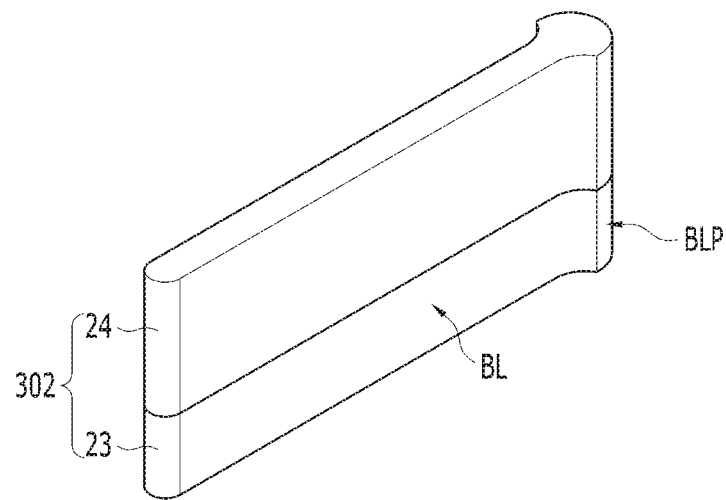
FIG. 6B is a schematic diagram illustrating a bit line structure of FIG. 5G.

FIG. 6B is a schematic diagram illustrating a bit line structure 302 of FIG. 5G. Referring to FIG. 6B, one-bit line structure 302 may have a structure where the bit line 23 and the bit line capping layer 24 are sequentially stacked. The bit line 23 may include a line portion BL and a pad portion BLP. The bit line capping layer 24 may also have the same shape as the bit line 23. The pad portion BLP may correspond to the pad portion BLP which is defined in advance when the preliminary bit line pattern (301 in FIGS. 5E and 6A) is formed. The coupling portion of the pad portion (BLP) and the line portion (BL) may be deformed when the bit line structure 302 is formed.

According to the embodiments of the present invention, the fabrication process may be simplified by simultaneously forming a line pattern portion and a pad pattern portion.

Also, according to the embodiments of the present invention, since the line pattern portion is formed after a pad portion is formed, the patterning process may be simplified substantially.

Also, since the size of the pad portion may be readily adjusted, a bridge margin between neighboring patterns may be improved.

While the present invention has been described with respect to the specific embodiments, it will be apparent to those skilled in the art that various changes and modifications may be made without departing from the spirit and scope of the invention as defined in the following claims.

What is claimed is:

1. A method for forming a pattern, comprising:
   forming a preliminary pattern having a plate portion and a plurality of pad portions protruding from an end of the plate portion over a substrate;
   forming a first hard mask pattern including a blocking portion covering the pad portions and a plurality of line portions partially covering the plate portion;
   forming a spacer on a sidewall of each of the line portions;
   forming a second hard mask pattern filling a space between the line portions to contact the spacer;
   forming an opening that exposes the plate portion between the first hard mask pattern and the second hard mask pattern by removing the spacer; and
   forming a plurality of line pattern portions that are respectively coupled to the pad portions by etching an exposed portion of the plate portion through the opening.

2. The method of claim 1, wherein in the forming of the first hard mask pattern, the line portions are extended in a first direction, and the blocking portion is extended in a second direction that intersects with the first direction, and the line portions protrude from the blocking portion to form a comb-shape pattern.

3. The method of claim 1, wherein in the forming of the preliminary pattern includes:

forming an etch target layer over the substrate;

forming an etch mask layer that includes a pad defining portion corresponding to the pad portions and a plate defining portion corresponding to the plate portion over the etch target layer; and etching the etch target layer by using the etch mask layer to form the preliminary pattern.

4. The method of claim 1, wherein the forming of the first hard mask pattern includes:

forming a hard mask pattern over the preliminary pattern;

forming a mask pattern that includes a body portion corresponding to the blocking portion and a line defining portion corresponding to the line portions over the hard mask pattern; and etching the hard mask pattern by using the mask pattern to form the first hard mask pattern.

5. The method of claim 4, wherein in the forming of the mask pattern includes, the line defining portion is extended in the first direction, and the body portion is extended in the second direction that intersects with the first direction, and a plurality of line defining portions protrude from the body portion to form a comb-shape pattern.

6. The method of claim 1, wherein the spacer is formed to have a narrower width than a width of the line portions of the first hard mask pattern.

7. The method of claim 1, wherein the first hard mask pattern and the second hard mask pattern are positioned at the same level.

8. The method of claim 1, wherein the first hard mask pattern and the second hard mask pattern are formed of the same material.

9. The method of claim 1, wherein the forming of the first hard mask pattern includes:

forming a coupling portion between the blocking portion and the line portions in a round shape, and the round shape makes the blocking portion partially cover the pad portions.

10. The method of claim 1, wherein the forming of the first hard mask pattern includes:

forming a coupling portion between the blocking portion and the line portions in an orthogonal shape, and wherein the orthogonal shape makes the blocking portion fully cover the pad portions.

11. The method of claim 1, wherein the forming of the second hard mask pattern includes:

forming a hard mask layer that fills a space between the line portions over the first hard mask pattern and the spacer; and selectively removing the hard mask pattern to form the second hard mask pattern that remains between the line portions.

12. The method of claim 1, wherein the line pattern portions include bit lines, and the pad portions include bit line pad portions that are coupled to ends of the bit lines.

13. The method of claim 1, wherein in the forming of the preliminary pattern, the preliminary pattern includes a plate-shaped plate portion, a plurality of first pad portions that protrude from opposite ends of the plate portion, and a plurality of second pad portions.

14. The method of claim 13, wherein the first pad portions and the second pad portions are arrayed not to be on the same straight line.

15. The method of claim 13, wherein in the forming of the first hard mask pattern, the blocking portion of the first hard mask pattern includes a first blocking portion that covers the first pad portions, and the line portions of the first hard mask pattern include a plurality of first line portions that are extended from the first blocking portion to form a comb-shape pattern.

16. The method of claim 14, wherein in the forming of the second hard mask pattern, the second hard mask pattern includes a second blocking portion that covers the second pad portions and includes a plurality of second line portions that are extended from the second blocking portion to form a comb shape, and the first line portions and the second line portions are arrayed in parallel.

17. The method of claim 16, wherein the opening is disposed between the first hard mask pattern and the second hard mask pattern, and the opening is formed in a wave shape or a pulse shape.

18. The method of claim 13, wherein in the forming of the first hard mask pattern, the blocking portion of the first hard mask pattern includes a first blocking portion that covers the second pad portions, and the line portions of the first hard mask pattern include a plurality of first line portions that are extended from the first blocking portion to form a comb shape, and the first hard mask pattern further includes a comb-shaped opening, and the comb-shaped opening exposes the first pad portions and partially exposes the plate portion.

19. The method of claim 18, wherein in the forming of the spacer, the spacer is formed on a sidewall of the comb-shaped opening.

20. The method of claim 19, wherein in the forming of the second hard mask pattern, the second hard mask pattern is formed to fill the comb-shaped opening, and the second hard mask pattern includes a second blocking portion that covers the first pad portions and second line portions that are extended from the second blocking portion to form a comb-shape pattern.

* * * * *